(12) United States Patent
Tanase et al.

(10) Patent No.: US 7,557,874 B2
(45) Date of Patent: Jul. 7, 2009

(54) DISPLAY DEVICE

(75) Inventors: Kenji Tanase, Gifu (JP); Kazunobu Mameno, Kyoto (JP); Norio Koma, Gifu (JP); Manabu Takemoto, Gifu (JP)

(73) Assignees: Sanyo Electric Co., Ltd., Osaka (JP); Epson Imaging Devices Corporation, Nagano (JP)

( * ) Notice: Subject to any disclaimer, the term of this patent is extended or adjusted under 35 U.S.C. 154(b) by 0 days.

(21) Appl. No.: 12/190,942

(22) Filed: Aug. 13, 2008

(65) Prior Publication Data

US 2008/0303983 A1 Dec. 11, 2008

Related U.S. Application Data

(62) Division of application No. 11/436,883, filed on May 19, 2006, now Pat. No. 7,429,753.

(30) Foreign Application Priority Data

May 20, 2005 (JP) .............................. 2005-148489
May 20, 2005 (JP) .............................. 2005-148490

(51) Int. Cl.
*G02F 1/1335* (2006.01)
(52) U.S. Cl. .............................. 349/63; 257/40; 257/59; 257/72; 349/78; 349/69; 349/113; 349/67
(58) Field of Classification Search ........................ None
See application file for complete search history.

(56) References Cited

U.S. PATENT DOCUMENTS 5,275,680 A 1/1994 Sirkin et al.
5,796,509 A 8/1998 Doany et al.

(Continued)

FOREIGN PATENT DOCUMENTS

CN 1577001 2/2005

(Continued)

OTHER PUBLICATIONS

Tanase et al., U.S. Appl. No. 12/190,442, filed Aug. 12, 2008, specification and drawings (51 pages).

(Continued)

*Primary Examiner*—Fei Fei Yeung Lopez
(74) *Attorney, Agent, or Firm*—Morrison & Foerster LLP

(57) ABSTRACT

The invention is directed to a higher contrast in a display device having a lighting device as a front light. A lighting portion is attached to a reflective liquid crystal display portion. A first transparent substrate and a second transparent substrate made of a glass substrate etc. are attached to each other with a sealing layer coated on those peripheral portions therebetween. The back surface of the first transparent substrate is attached to the reflective liquid crystal display portion, and an organic EL element is formed on the front surface of the first transparent substrate. The organic EL element is sealed in a space surrounded by the first transparent substrate, the second transparent substrate, and the sealing layer. The organic EL element is formed in a region corresponding to a pixel region of the reflective liquid crystal display portion. A desiccant layer is formed on the front surface of the second transparent substrate.

14 Claims, 23 Drawing Sheets

U.S. PATENT DOCUMENTS

| | | | |
|---|---|---|---|
| 6,025,894 | A | 2/2000 | Shirasaki et al. |
| 6,181,394 | B1 | 1/2001 | Sanelle et al. |
| 6,208,391 | B1 | 3/2001 | Fukushima et al. |
| 6,441,873 | B2 | 8/2002 | Young |
| 6,528,824 | B2 | 3/2003 | Yamagata et al. |
| 6,542,207 | B1 | 4/2003 | Yoshizawa |
| 6,556,260 | B1 | 4/2003 | Itou et al. |
| 6,671,014 | B2 | 12/2003 | Yokoyama et al. |
| 6,723,392 | B1 | 4/2004 | Jinnai et al. |
| 7,034,911 | B2 | 4/2006 | Kato |
| 7,245,343 | B2 | 7/2007 | Suzuki et al. |
| 7,248,331 | B2 | 7/2007 | Miyatake et al. |
| 2001/0035924 | A1 | 11/2001 | Fujieda |
| 2002/0122144 | A1 | 9/2002 | Yoshida et al. |
| 2003/0156239 | A1 | 8/2003 | Inoue et al. |
| 2003/0209707 | A1 | 11/2003 | Tsuchiya |
| 2003/0214227 | A1* | 11/2003 | Tsuchiya .................... 313/504 |
| 2004/0125449 | A1 | 7/2004 | Sales |
| 2004/0141103 | A1 | 7/2004 | Kotchick et al. |
| 2004/0141106 | A1 | 7/2004 | Wu et al. |
| 2004/0179154 | A1 | 9/2004 | Hong |
| 2004/0206960 | A1 | 10/2004 | Nishikawa |
| 2005/0001545 | A1 | 1/2005 | Aitken et al. |
| 2005/0056840 | A1 | 3/2005 | Yamazaki et al. |
| 2005/0088594 | A1 | 4/2005 | Mitsui et al. |
| 2006/0132671 | A1 | 6/2006 | Koma |
| 2006/0261337 | A1 | 11/2006 | Koma |
| 2006/0262242 | A1 | 11/2006 | Koma |
| 2006/0279673 | A1 | 12/2006 | Tanase et al. |

FOREIGN PATENT DOCUMENTS

| | | |
|---|---|---|
| JP | 05-325586 | 12/1993 |
| JP | 2003-255375 | 9/2003 |
| JP | 2004-145067 | 2/2004 |
| WO | WO-2004/023173 | 3/2004 |

OTHER PUBLICATIONS

U.S. Office Action mailed on Mar. 24, 2009 directed towards related U.S. Appl. No. 11/436,712; 17 pages.

U.S. Office Action mailed on Apr. 28, 2009 directed towards related U.S. Appl. No. 11/436,638; 11 pages.

\* cited by examiner

DISPLAY DEVICE

CROSS-REFERENCE OF THE INVENTION

This application is based on Japanese Patent Application Nos. 2005-148489 and 2005-148490, the contents of which are incorporated herein by reference in their entireties.

This application is a divisional of Ser. No. 11/436,883, filed May 19, 2006, now U.S. Pat. No. 7,429,753.

BACKGROUND OF THE INVENTION

1. Field of the Invention

The invention relates to a display device having a lighting portion on a reflective liquid crystal display portion.

2. Description of the Related Art

A liquid crystal display device (hereafter, referred to as a LCD) is thin and consumes low power in its characteristics, and has been broadly used as a monitor of a computer or a monitor of a mobile data terminal such as a cellular phone. There are a transmissive LCD, a reflective LCD, and a semi-transmissive LCD as the LCD.

In the transmissive LCD, a transparent electrode is used as a pixel electrode for applying a voltage to a liquid crystal and a back light is set in the rear of the LCD, so that a bright display can be realized by controlling a transmission amount of light of this back light even in the dark. However, in an environment where external light is strong such as out of doors in the daytime, a contrast can not be obtained enough.

The reflective LCD uses external light such as sunlight or interior light as a light source, and reflects the external light entering the LCD by a reflective pixel electrode formed of a reflective layer formed on a substrate on a viewer side. The reflective LCD makes a display by controlling an amount of light released from a LCD panel in each of the pixels after the light enters a liquid crystal and is reflected by the reflective pixel electrode. Since this reflective LCD uses external light as a light source, there is a problem that the display can not be made in an environment of no external light.

The semi-transmissive LCD has both the transmissive function and the reflective function, and is applicable to both the bright and dark environments. However, since this semi-transmissive LCD has a transmissive region and a reflective region in a pixel, there is a problem of low display efficiency in each of the pixels.

For solving this, it has been suggested that a front light is provided in the reflective LCD to realize a display even in the dark environment. FIG. 31 is a view showing the reflective LCD with the front light. A transparent acrylic plate 110 is disposed, being opposed to a display surface of a reflective LCD 100. A plurality of grooves 111 shaped in inverted triangles is formed on a surface of this transparent acrylic plate 110, which is on the opposite side to the side opposed to the reflective LCD. Furthermore, a light source 112 is disposed on a side surface of the transparent acrylic plate 110. Light entering the transparent acrylic plate 110 from the light source 112 is refracted in a direction to the reflective LCD 100 by inclined surfaces of the grooves 111, and enters the display surface of the reflective LCD 100.

The relating technology is described in the Japanese Patent Application Publication No. 2003-255375.

However, the light entering the transparent acrylic plate 110 from the light source 112 is refracted in a direction to a viewer 113 on the opposite side to the reflective LCD 100 by a small amount as well as in the direction to the reflective LCD 100 by the inclined surfaces of the grooves 111 provided in the transparent acrylic plate 110. Therefore, the small amount of light leaks from the transparent acrylic plate 110 to reach the eyes of the viewer 113, causing a problem of degrading the contrast of a LCD display.

SUMMARY OF THE INVENTION

The features of the invention are as follows.

A display device of the invention as the first feature includes a lighting portion disposed on a reflective liquid crystal display portion, the lighting portion including: a first substrate attached to the reflective liquid crystal display portion on its back surface; a second substrate attached to the first substrate with a sealing layer interposed therebetween; and an organic electroluminescent element disposed on a front surface of the first substrate including an anode layer made of a transparent electrode material and having a predetermined pattern, an organic layer covering the anode layer, and a cathode layer having a pattern superposed on the anode layer with the organic layer interposed therebetween, and the reflective liquid crystal display portion including: a plurality of pixels; a third substrate formed with a reflective pixel electrode receiving light emitted by the organic electroluminescent element in each of the pixels; a fourth substrate disposed on the third substrate and formed with a common electrode on its front surface; and a liquid crystal layer sealed between the third substrate and the fourth substrate.

A display device of the invention as the second feature includes a lighting portion disposed on a reflective liquid crystal display portion, the lighting portion including: a first substrate attached to the reflective liquid crystal display portion on its back surface; a second substrate attached to the first substrate with a sealing layer interposed therebetween; an organic electroluminescent element disposed on a front surface of the second substrate including an anode layer, an organic layer covering the anode layer, and a cathode layer formed on the organic layer to have a predetermined pattern and made of a semitransparent electrode material; and a light shield layer formed under the anode layer to have a pattern corresponding to the cathode layer and shielding light emitted by the organic electroluminescent element, and the reflective liquid crystal display portion including: a plurality of pixels; a third substrate formed with a reflective pixel electrode receiving light emitted by the organic electroluminescent element in each of the pixels; a fourth substrate disposed on the third substrate and formed with a common electrode on its front surface; and a liquid crystal layer sealed between the third substrate and the fourth substrate.

A display device of the invention as the third feature includes a lighting portion disposed on a reflective liquid crystal display portion, the lighting portion including: a first substrate attached to the reflective liquid crystal display portion on its back surface; a second substrate attached to the first substrate with a sealing layer interposed therebetween; and an organic electroluminescent element disposed on a front surface of the second substrate including a cathode layer having a predetermined pattern, an organic layer covering the cathode layer, and an anode layer made of a semitransparent or transparent material on the organic layer, and the reflective liquid crystal display portion including: a plurality of pixels; a third substrate formed with a reflective pixel electrode receiving light emitted by the organic electroluminescent element in each of the pixels; a fourth substrate disposed on the third substrate and formed with a common electrode on its front surface; and a liquid crystal layer sealed between the third substrate and the fourth substrate.

The display device of the invention uses an organic electroluminescent element of a bottom emission type (a type of emitting light from organic electroluminescent element toward a substrate formed with the organic electroluminescent element) as a front light, and can realize a bright and high contrast liquid crystal display in both bright and dark environments.

DETAILED DESCRIPTION OF THE INVENTION

Figure 1:
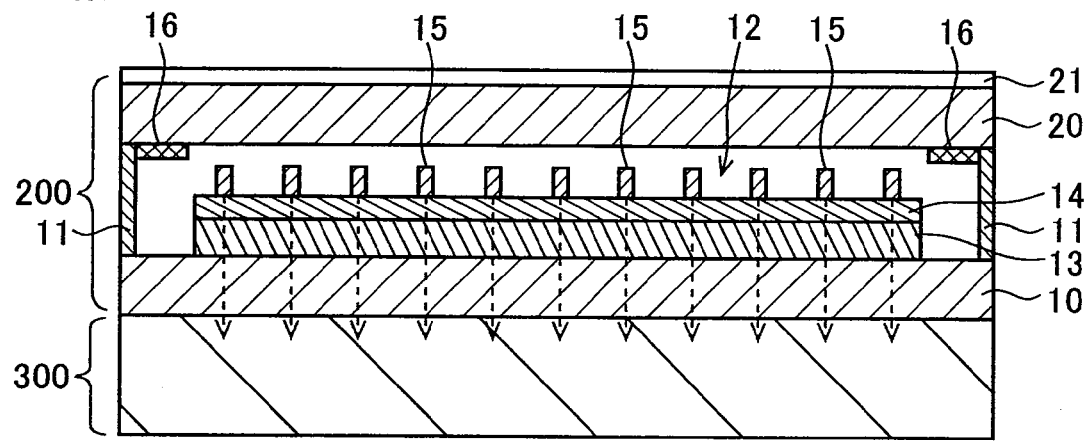
FIG. 1 is a first cross-sectional view of a display device of a first embodiment of the invention.

A display device of a first embodiment of the invention will be described referring to figures. First, the whole structure of this display device will be described referring to FIG. 1. A lighting portion 200 is attached on a reflective liquid crystal display portion 300. The structure of the lighting portion 200 is as follows. A first transparent substrate 10 and a second transparent substrate 20 made of a glass substrate, etc. are attached to each other with a sealing layer 11 made of resin, etc. coated on those peripheral portions therebetween.

The back surface of the first transparent substrate 10 is attached to the reflective liquid crystal display portion 300, and an organic electroluminescent element 12 (hereafter, referred to as an "organic EL element 12") is formed on the front surface of the first transparent substrate 10. Thus, the organic EL element 12 is sealed in a space surrounded by the first transparent substrate 10, the second transparent substrate 20, and the sealing layer 11. The organic EL element 12 is formed in a region corresponding to a pixel region 310 (see FIG. 3) of the reflective liquid crystal display portion 300.

The organic EL element 12 has an anode layer 13 formed on the first transparent substrate 10, an organic layer 14 formed covering this anode layer 13, and a plurality of cathode layers 15 with a linear pattern formed on this organic layer 14. The anode layer 13 is made of a transparent conductive material such as ITO (Indium Tin Oxide) or IZO (Indium Zinc Oxide). The organic layer 14 is made of an electron transport layer, and an missive layer, and a hole transport layer. The cathode layer 15 is, for example, an aluminum layer (Al layer), or a layered body made of a magnesium layer (Mg layer) and a silver layer (Ag layer). It is preferable that the anode layer 13 is 100 nm, the organic layer 14 is 200 nm, and the cathode layer 15 is 500 nm in thickness.

A portion of the organic layer 14 that is interposed between the anode layer 13 and the cathode layer 15 is an emissive region. That is, a portion of the organic layer 14 immediately under the cathode layer 15 is the emissive region, and this emissive region forms the same linear pattern as the cathode layer 15 in its plan view. The emissive region emits light by applying a positive potential to the anode layer 13 and a negative potential to the cathode layer 15.

Light emitted downward from the emissive region goes to the reflective liquid crystal display portion 300 through the transparent anode layer 13 and the first transparent substrate 10. Most of light emitted upward from the emissive region is reflected downward by the cathode layer 15 and goes to the reflective liquid crystal display portion 300 through the transparent anode layer 13 and the first transparent substrate 10. This minimizes the light emitted from the emissive region from directly entering the eyes of a viewer watching the lighting portion 200 from thereabove, and thus enhances the display contrast of the reflective liquid crystal display portion 300.

The anode layer 13 can be formed in a predetermined region by a photoetching technology after a transparent conductive material such as ITO or IZO is formed on the first transparent substrate 10. The organic layer 14 and the cathode layer 15 can be formed in a predetermined region by a vapor-deposition method using a mask.

Since moisture infiltration degrades the emission characteristics of the organic EL element 12, it is preferable to form a desiccant layer 16 on the front surface of the second transparent substrate 20 so as to face the first transparent substrate 10, for preventing the infiltration. Moisture infiltrating into the sealed space through the sealing layer 11 is absorbed by the desiccant layer 16.

It is preferable that the desiccant layer 16 is formed on the peripheral portion of the second transparent substrate 20 without overlapping the organic EL element 12 so as to avoid blocking external light entering the organic EL element 12 through the second transparent substrate 20. However, the desiccant layer 16 is not necessarily formed in such a manner when it is made of a transparent material. It is preferable to attach an antireflection film 21 on the back surface of the second transparent substrate 20 for preventing reflection of external light.

Figure 2:
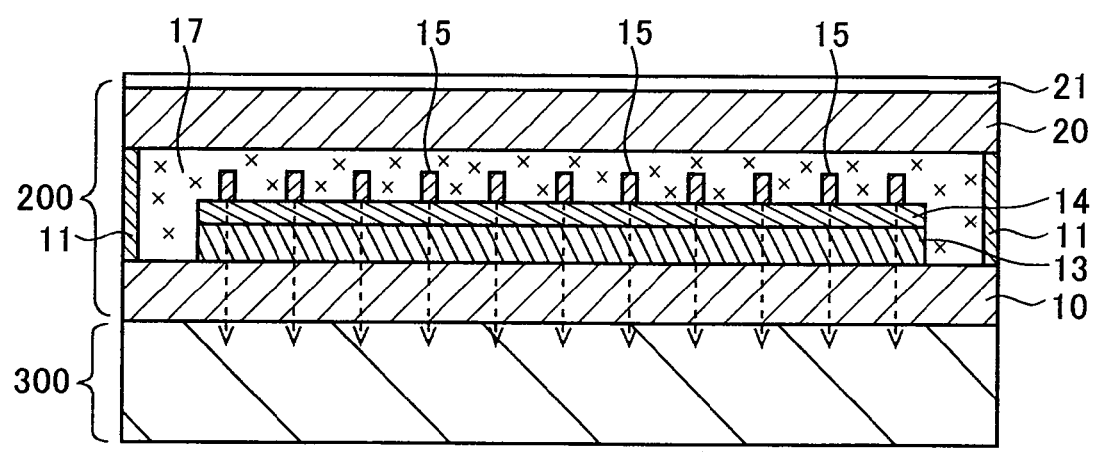
FIG. 2 is a second cross-sectional view of the display device of the first embodiment of the invention.

It is possible to fill the space surrounded by the first transparent substrate 10, the second transparent substrate 20, and the sealing layer 11 with resin 17 having the same or almost the same refractive index as that of the first transparent substrate 10, as shown in FIG. 2. Alternatively, the resin 17 and the sealing layer 11 can be formed integrally.

With this structure, moisture infiltrating through the sealing layer 11 can be certainly blocked. Since an air layer exists between the organic EL element 12 and the second transparent substrate 20 in the structure of FIG. 1, external light entering the second transparent substrate 20 is reflected by an interface between the air layer and the second transparent substrate 20, thereby degrading the contrast of a liquid crystal display. On the other hand, with the structure of FIG. 2, external light entering the second transparent substrate 20 enters the reflective liquid crystal display portion 300 without reflected by the interface of the second transparent substrate 20, thereby enhancing the contrast of a liquid crystal display. It is possible to provide the structure of FIG. 2 with the desiccant layer 16 of FIG. 1.

Figure 3:
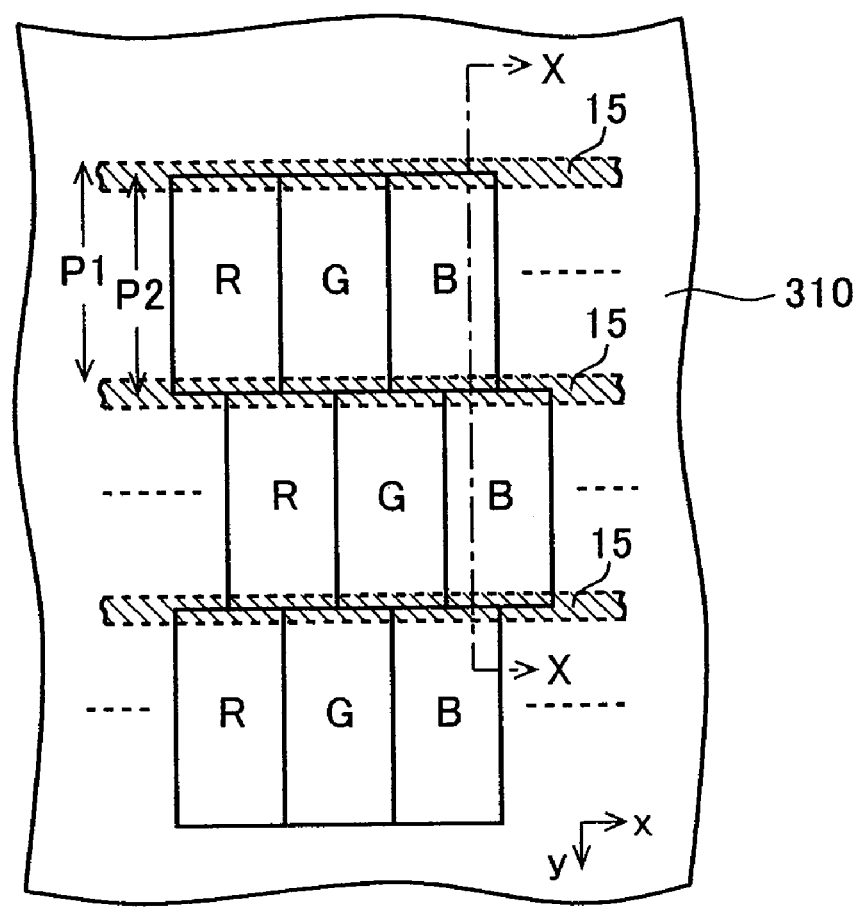
FIG. 3 is a plan view of a portion of a pixel region 310 of a reflective liquid crystal display portion 300.
Figure 4:
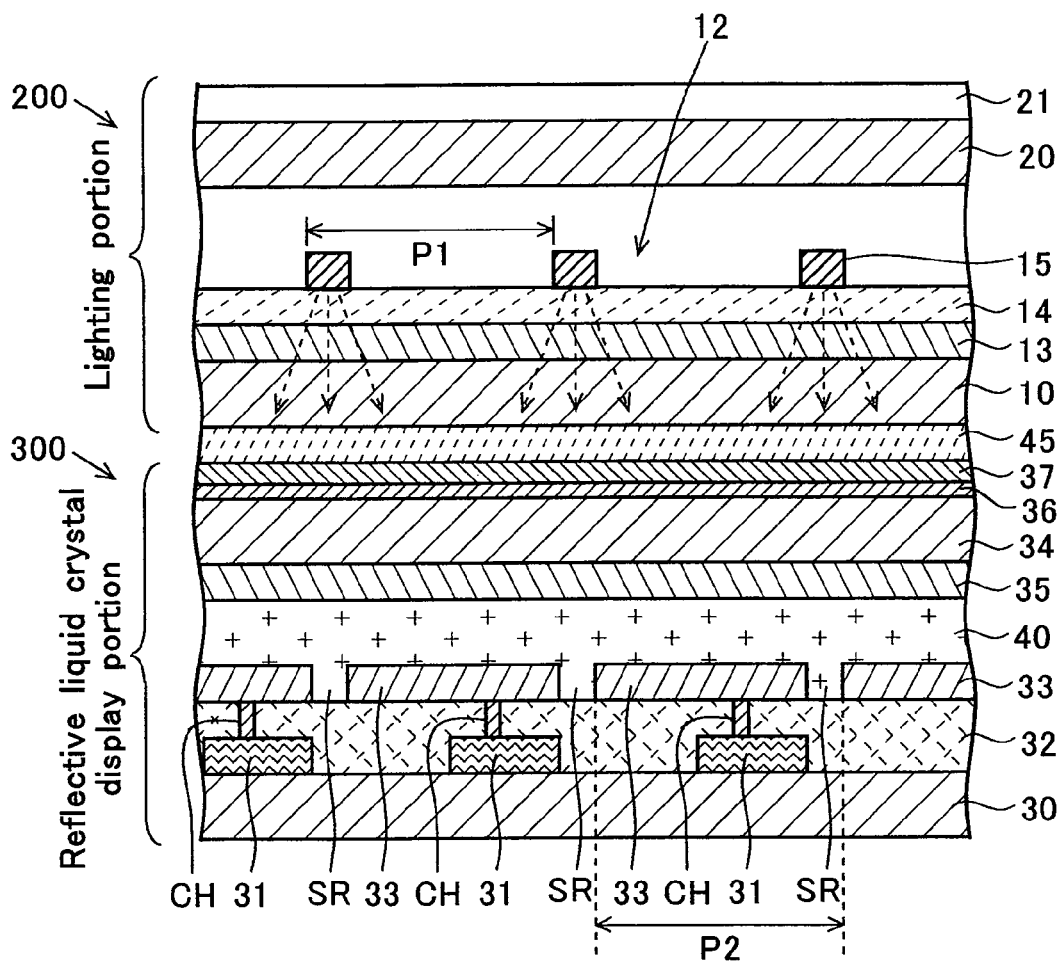
FIG. 4 is a cross-sectional view of FIG. 3 along line X-X.

Next, the structure of the reflective liquid crystal display portion 300 lighted by the described lighting portion 200 and its connection with the lighting portion 200 will be described referring to FIGS. 3 and 4. FIG. 3 is a plan view of a portion of the pixel region 310 of the liquid crystal display portion 300, and FIG. 4 is a cross-sectional view of FIG. 3 along line X-X. A switching thin film transistor 31 (hereafter, referred to as a TFT) is formed in each of the plurality of pixels provided on a third transparent substrate 30 (TFT substrate) made of a glass substrate. The TFT 31 is covered with an interlayer insulation film 32, and a reflective pixel electrode 33 made of a reflective material such as aluminum (Al) is formed on the interlayer insulation film 32, corresponding to each of the TFTs 31. The reflective pixel electrode 33 is connected with a drain or a source of the corresponding TFT 31 through a contact hole CH formed in the interlayer insulation film 32.

A fourth transparent substrate 34 (opposing substrate) made of a glass substrate is disposed, being opposed to the third transparent substrate 30 formed with the reflective pixel electrodes 33. A common electrode 35 made of ITO is formed on the front surface of the fourth transparent substrate 34. A light scattering layer 36 made of a diffusion adhesion layer and a polarizing plate 37 are layered on the back surface of the fourth transparent substrate 34 in this order. The light scattering layer 36 is provided for scattering light from the lighting portion 200 to equally irradiate the pixel electrode 33 with the light. A liquid crystal layer 40 is sealed between the fourth transparent substrate 34 and the third transparent substrate 30.

With the described structure, light emitted from the lighting portion 200 is polarized in a predetermined direction by the polarizing plate 37, passes through the light scattering layer 36, the fourth transparent substrate 34, and the common electrode 35, enters the liquid crystal layer 40, and is reflected by the reflective pixel electrodes 33. The light reflected by the reflective pixel electrodes 33 returns through the same route and is visually recognized by a viewer through spaces between the lines of the cathode layers 15.

At this time, light transmittance changes in each of the pixels by an electric field applied between the pixel electrodes 33 and the common electrode 35. Therefore, intensity of light reflected by the pixel electrodes 33 changes in each of the pixels, so that a LCD display can be realized. As described above, since the cathode layer 15 of the lighting portion 200 functions as a light shield layer and thus leakage of the light from the light emissive region of the organic EL element 12 can be minimized, the contrast of a LCD display can be enhanced.

It is preferable that the lighting portion 200 is disposed above the reflective liquid crystal display portion 300 adjacently. However, if an air layer exists between the lighting portion 200 and the reflective liquid crystal display portion 300, light emitted from the first transparent substrate 10 of the lighting portion 200 is reflected by an interface between the first transparent substrate 10 and the air layer when entering the air layer and returns to the viewer side, so that the contrast can be degraded.

Therefore, it is preferable to attach the lighting portion 200 and the reflective liquid crystal display portion 300 with a resin layer 45 (e.g. a UV curable resin layer or a visible light curable resin layer) having the same refractive index as that of the first transparent substrate 10 therebetween, for preventing the light reflection.

Next, a positional relationship between the lighting portion 200 and the pixels of the reflective LCD 300 will be described. As shown in FIG. 3, three types of pixels R, G, and B corresponding to three primary colors of red, green, and blue respectively are arrayed in a row direction (x) and a column direction (y) in the pixel region 310 of the reflective liquid crystal display portion 300. Although FIG. 3 shows a delta array where the pixels R, G, and B are shifted in each of the rows, the invention is not limited to this and can form a stripe array where the pixels R, G, and B are arrayed in order in each of the rows. The lines of the cathode layers 15 of the lighting portion 200 extend in the row direction (x) along the boundaries of the pixels R, G, and B.

Each of the pixels has a TFT 31 and a reflective pixel electrode 33. A pitch P1 of the lines of the cathode layers 15 of the lighting portion 200 is equal to a pitch P2 of the pixels. It is preferable to dispose the lines of the cathode layers 15 of the lighting portion 200 right above separating regions SR of the reflective pixel electrodes 33, which do not contribute to a liquid crystal display. This provides an advantage that most of light reflected by the reflective pixel electrodes 33 is visually recognized by a viewer through the spaces between the lines of the plurality of cathode layers 15 without blocked by the cathode layers 15.

It is possible that the pitch P1 of the lines of the cathode layers 15 of the lighting portion 200 is smaller than the pitch P2 of the pixels and a ratio of the pitch P1 of the lines of the cathode layers 15 to the pitch P2 of the pixels (P1/P2) is 1/natural number. Although interference fringes or moire fringes can occur in a liquid crystal display when the line pitch is equal to the pixel pitch, this setting can prevent such a phenomenon.

Alternatively, it is possible that the pitch P1 of the cathode layers 15 of the lighting portion 200 is larger than the pitch P2 of the pixels and a ratio of the line pitch P1 to the pixel pitch P2 (P1/P2) is a natural number. This setting can prevent interference fringes or moire fringes.

Figure 5:
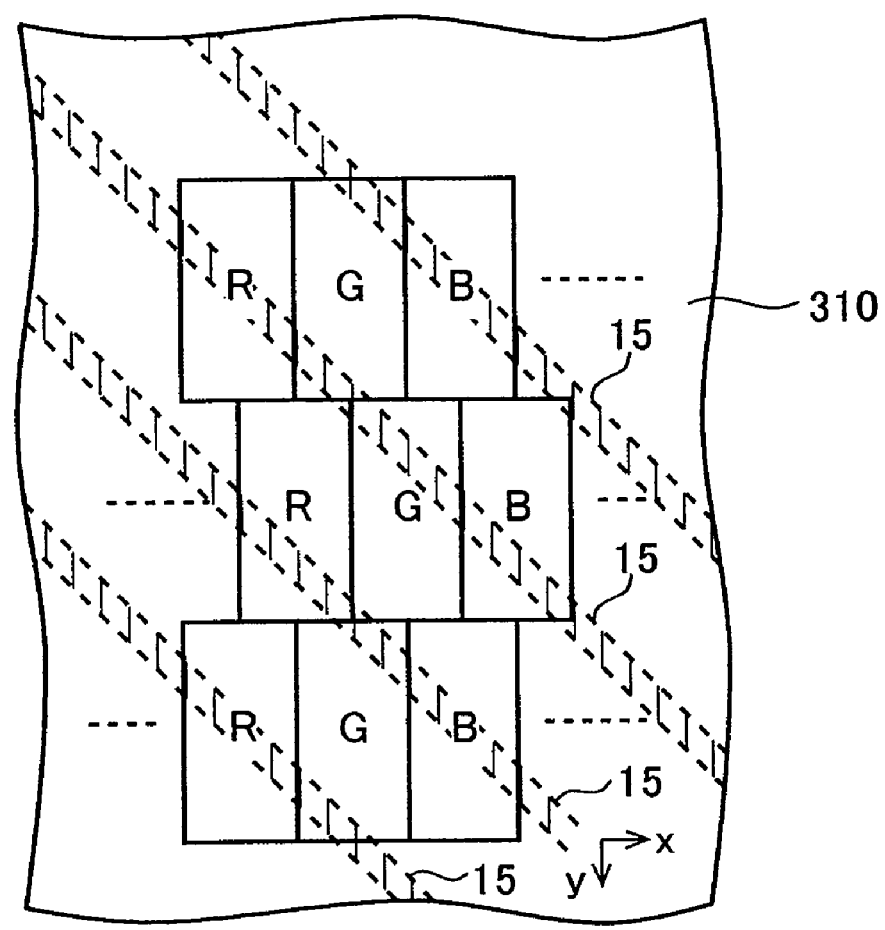
FIG. 5 is a plan view of a portion of the pixel region 310 of the reflective liquid crystal display portion 300.

The lines of the cathode layers 15 of the lighting portion 200 can obliquely extend deviated from the row direction (x) as shown in FIG. 5. This setting can prevent interference fringes or moire fringes.

Figure 6:
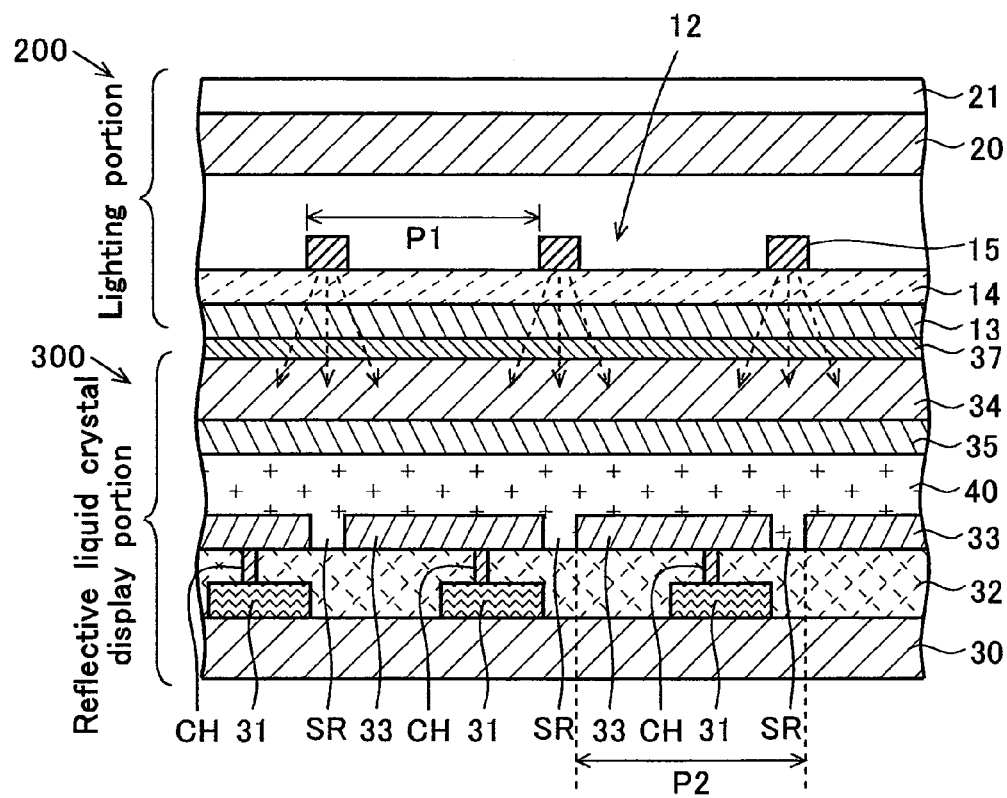
FIG. 6 is a cross-sectional view of a display device of a second embodiment of the invention.

Next, a display device of a second embodiment of the invention will be described referring to FIG. 6. FIG. 6 is a cross-sectional view showing a structure of a reflective liquid crystal display portion 300 and its connection with a lighting portion 200, which corresponds to the cross-sectional view of FIG. 3 along line X-X. The feature of this embodiment is that the first transparent substrate 10 and the fourth transparent substrate 34 of the first embodiment are combined together as a transparent substrate. That is, as shown in FIG. 6, a first transparent substrate 10 is omitted and an organic EL element 12 is formed on a fourth transparent substrate 34. This can reduce the total thickness of the display device and a cost.

Figure 7:
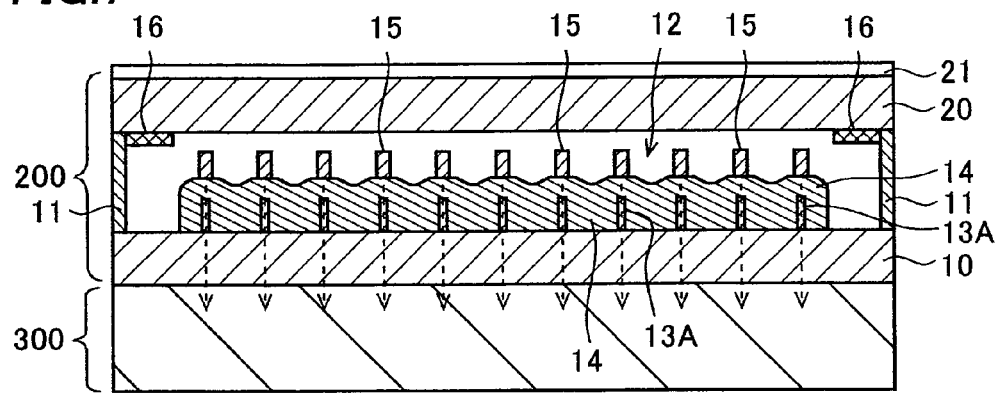
FIG. 7 is a first cross-sectional view of a display device of a third embodiment of the invention.

Next, a display device of a third embodiment of the invention will be described referring to figures. FIG. 7 is a cross-sectional view of the whole display device. An anode layer 13A of an organic EL element 12 has a linear pattern in this embodiment, while the anode layer 13 of the organic EL element 12 of the first embodiment (FIG. 1) does not have a linear pattern.

That is, the plurality of anode layers 13A having a linear pattern is formed on the first transparent substrate 10, an organic layer 14 is formed covering these anode layers 13A, and a plurality of cathode layers 15 having the same linear pattern is formed on this organic layer 14. The lines of the cathode layers 15 and the lines of the anode layers 13A formed thereunder are superposed. The other structure than this is the same as that of the first embodiment.

When the anode layer 13 made of ITO or IZO is formed on the first transparent substrate 10 without being separated into plural numbers as in the first embodiment (FIG. 1), external light entering through the second transparent substrate 20 or light emitted from the organic EL element 12 is reflected by the anode layer 13 due to a difference in refractive index, thereby degrading the contrast of a liquid crystal display. On the other hand, light passing between the lines of the anode layers 13A is not reflected by the anode layer 13A in this embodiment. Therefore, light transmittance increases, thereby enhancing the contrast of a liquid crystal display.

Figure 8:
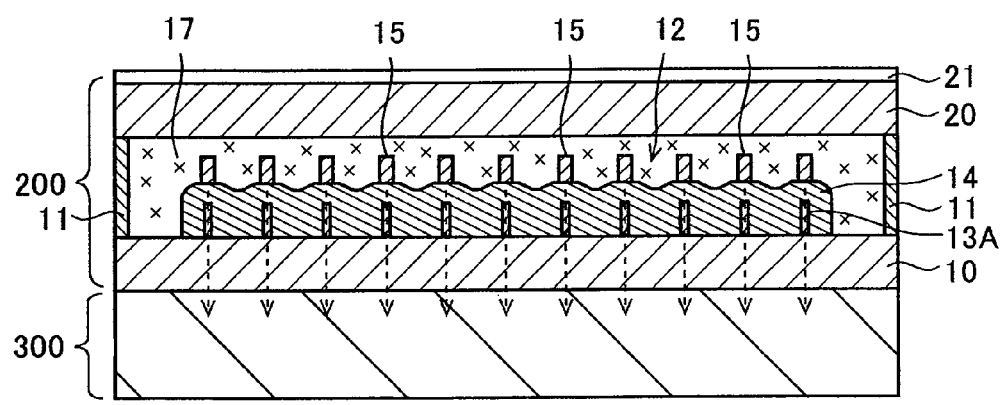
FIG. 8 is a second cross-sectional view of the display device of the third embodiment of the invention.

Although a desiccant layer 16 is formed on the front surface of the second transparent substrate 20 so as to face a first transparent substrate 10 in the structure of FIG. 7, it is possible to fill a space surrounded by the first transparent substrate 10, the second transparent substrate 20, and the sealing layer 11 with resin 17 having the same refractive index as that of the first transparent substrate as shown in FIG. 8.

Figure 9:
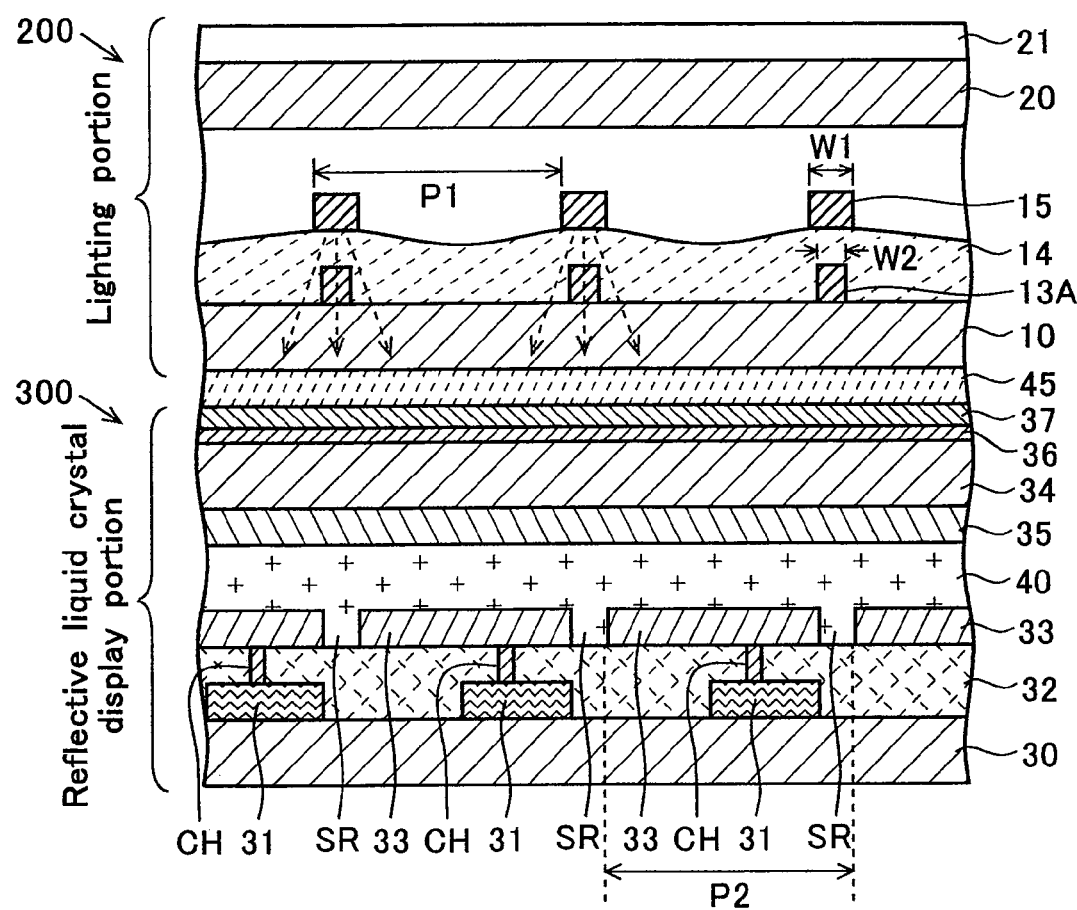
FIG. 9 is a third cross-sectional view of the display device of the third embodiment of the invention.

FIG. 9 is a cross-sectional view showing a structure of the reflective liquid crystal display portion 300 and its connection with the lighting portion 200, which corresponds to the cross-sectional view of FIG. 3 along line X-X. The structure of the reflective liquid crystal display portion 300 is totally the same as that of the first embodiment. It is preferable to dispose the lines of the cathode layers 15 of the lighting portion 200 right above the separating regions SR of the reflective pixel electrodes 33, which do not contribute to a liquid crystal display, as described above. The lines of the anode layers 13A are also superposed on the lines of the cathode layers 15. A portion of the organic layer 14 interposed between the lines of the anode layers 13A and the lines of the cathode layers 15 serves as an emissive region. The lines of the cathode layers 15 prevent leakage of light emitted by the emissive region. By setting a width W1 of the lines of the cathode layers 15 larger than a width W2 of the lines of the anode layers 13A, the leakage of the light can be reduced more and the contrast of a liquid crystal display can be further enhanced.

Figure 10:
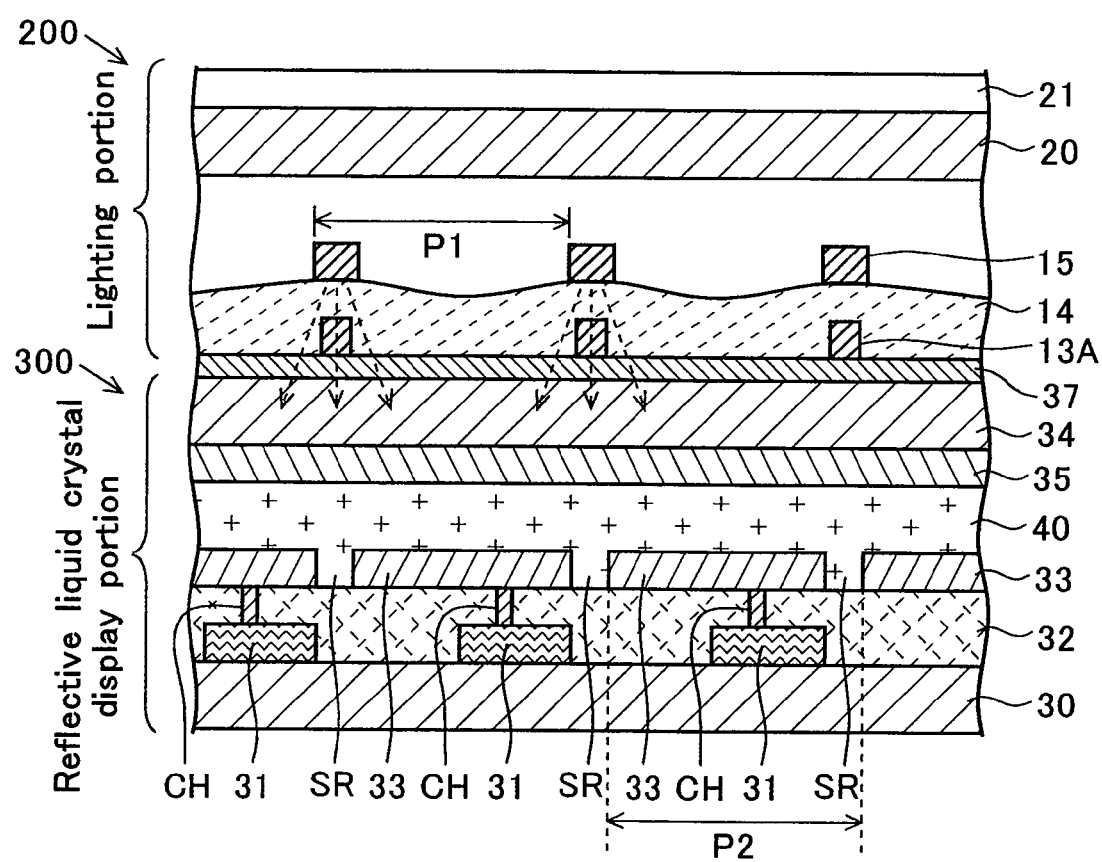
FIG. 10 is a cross-sectional view of a display device of a fourth embodiment of the invention.

Next, a display device of a fourth embodiment of the invention will be described referring to FIG. 10. FIG. 10 is a cross-sectional view showing a structure of a reflective liquid crystal display portion 300 and its connection with a lighting portion 200, which corresponds to the cross-sectional view of FIG. 3 along line X-X. The feature of this embodiment is that the first transparent substrate 10 and the fourth transparent substrate 34 of the third embodiment are combined together as a transparent substrate. That is, a first transparent substrate 10 is omitted and an organic EL element 12 is formed on a fourth transparent substrate 34 as shown in FIG. 10. This can reduce the total thickness of the display device and a cost.

Figure 11:
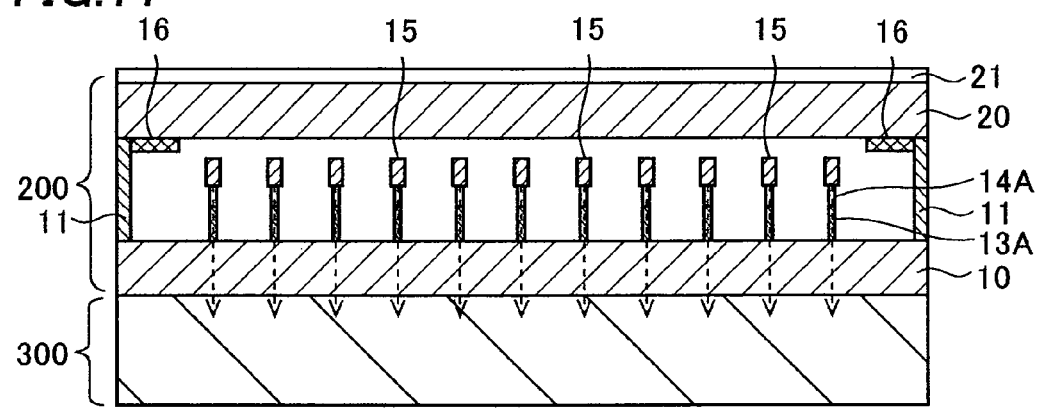
FIG. 11 is a first cross-sectional view of a display device of a fifth embodiment of the invention.

Next, a display device of a fifth embodiment of the invention will be described referring to figures. FIG. 11 is a cross-sectional view of the whole display device. An anode layer 13A and an organic layer 14A of an organic EL element 12 have a linear pattern in this embodiment, while the anode layer 13 and the organic layer 14 of the organic EL element 12 of the first embodiment (FIG. 1) do not have a linear pattern.

That is, the plurality of anode layers 13A having a linear pattern is formed on the first transparent substrate 10, the plurality of organic layers 14A having a linear pattern is layered on these anode layers 13A, and the plurality of cathode layers 15 having the same linear pattern is formed on these organic layers 14A. The lines of the cathode layers 15A, and the lines of the organic layers 14A and the lines of the anode layers 13A formed thereunder are superposed. The other structure than this is the same as the structure of the first embodiment.

When the anode layer 13 made of ITO or IZO having a nonlinear pattern is formed on the first transparent substrate 10 as in the first embodiment (FIG. 1), external light entering through the second transparent substrate 20 or light emitted by the organic EL element 12 is reflected by the anode layer 13 due to a difference in refractive index, thereby degrading the contrast of a liquid crystal display. The same reflection occurs by the organic layer 14, too.

On the other hand, light passing between the lines of the anode layers 13A and the organic layers 14A is not reflected by these layers in this embodiment. Therefore, light transmittance increases, enhancing the contrast of a liquid crystal display.

Figure 12:
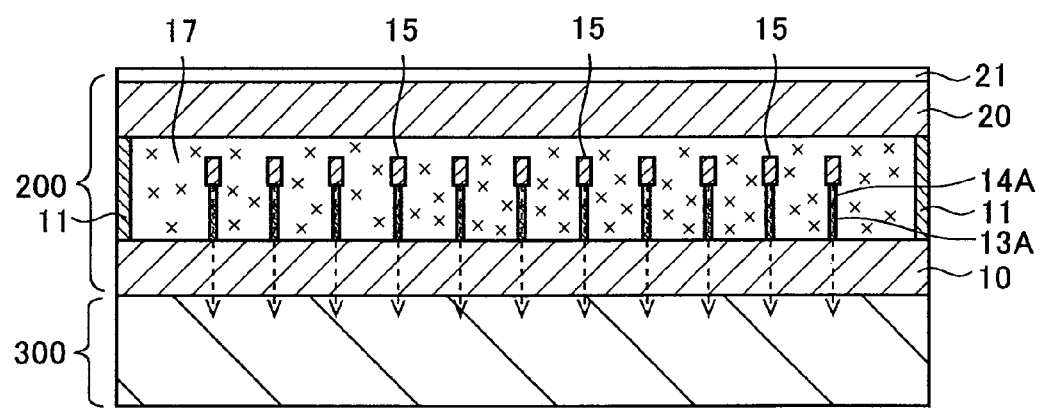
FIG. 12 is a second cross-sectional view of the display device of the fifth embodiment of the invention.

Although a desiccant layer 16 is formed on the front surface of the second transparent substrate 20, facing the first transparent substrate 10 in the structure of FIG. 11, it is possible to fill a space surrounded by the first transparent substrate 10, the second transparent substrate 20, and the sealing layer 11 with resin 17 having the same refractive index as that of the first transparent substrate as shown in FIG. 12.

Figure 13:
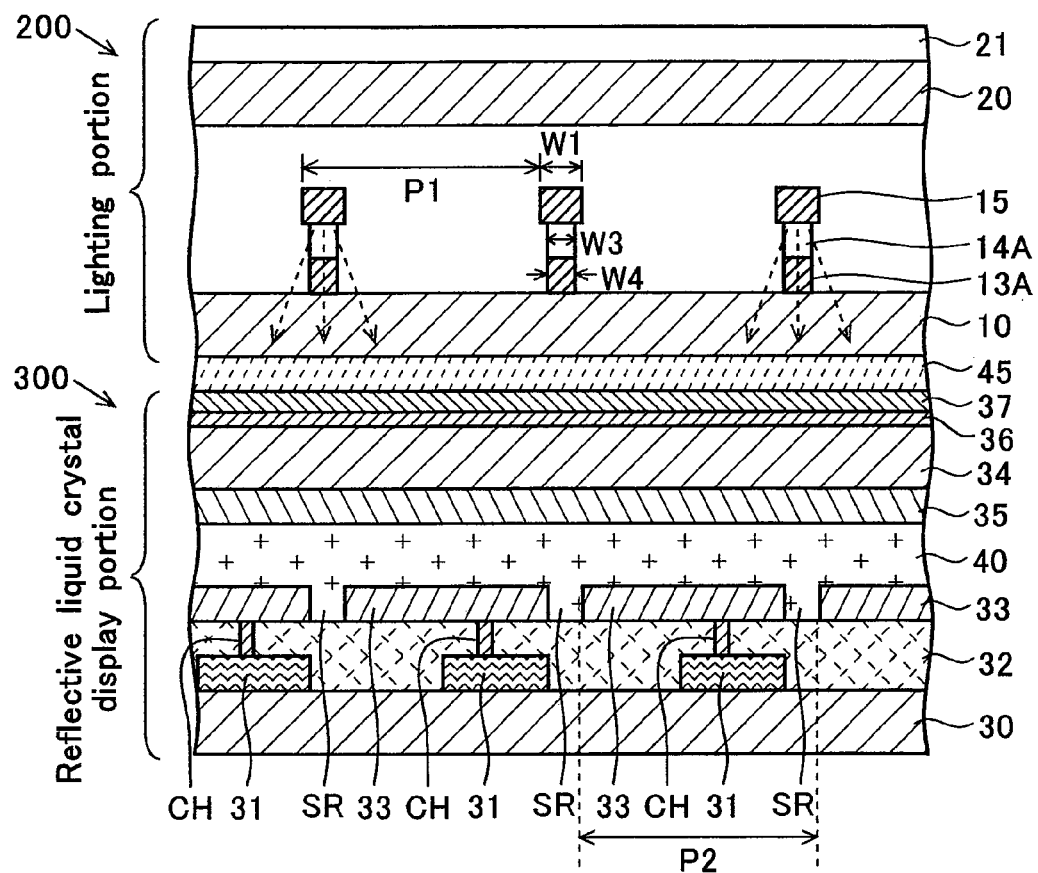
FIG. 13 is a third cross-sectional view of the display device of the fifth embodiment of the invention.

FIG. 13 is a cross-sectional view showing a structure of the reflective liquid crystal display portion 300 and its connection with the lighting portion 200, which corresponds to the cross-sectional view of FIG. 3 along line X-X. The structure of the reflective liquid crystal display portion 300 is totally the same as that of the first embodiment. It is preferable to dispose the lines of the cathode layers 15 of the lighting portion 200 right above the separating regions SR of the reflective pixel electrodes 33, which do not contribute to a liquid crystal display, as described above. In this case, the lines of the anode layers 13A and the organic layers 14A are also superposed on the lines of the cathode layers 15. The lines of the organic layers 14A interposed between the lines of the anode layers 13A and the lines of the cathode layers 15 serve as emissive regions. The lines of the cathode layers 15 prevent leakage of light emitted by the emissive regions. By setting a width W1 of the lines of the cathode layers 15 larger than a width W3 of the lines of the organic layers 14A and a width W4 of the lines of the anode layers 13A, the leakage of the light can be reduced more and the contrast of a liquid crystal display can be further enhanced.

Figure 14:
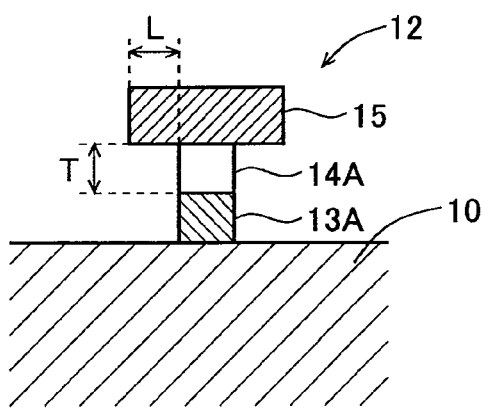
FIG. 14 is a cross-sectional view of an organic EL element of the display device of the fifth embodiment of the invention.

It is preferable to set a length L between an edge of the lines of the cathode layers 15 and an edge of the lines of the organic layers 14A larger than a thickness T of the organic layers 14A for further reducing leakage of light, as shown in FIG. 14. It is possible to set the width W3 of the lines of the organic layers 14A larger than the width W4 of the lines of the anode layers 13A.

Figure 15:
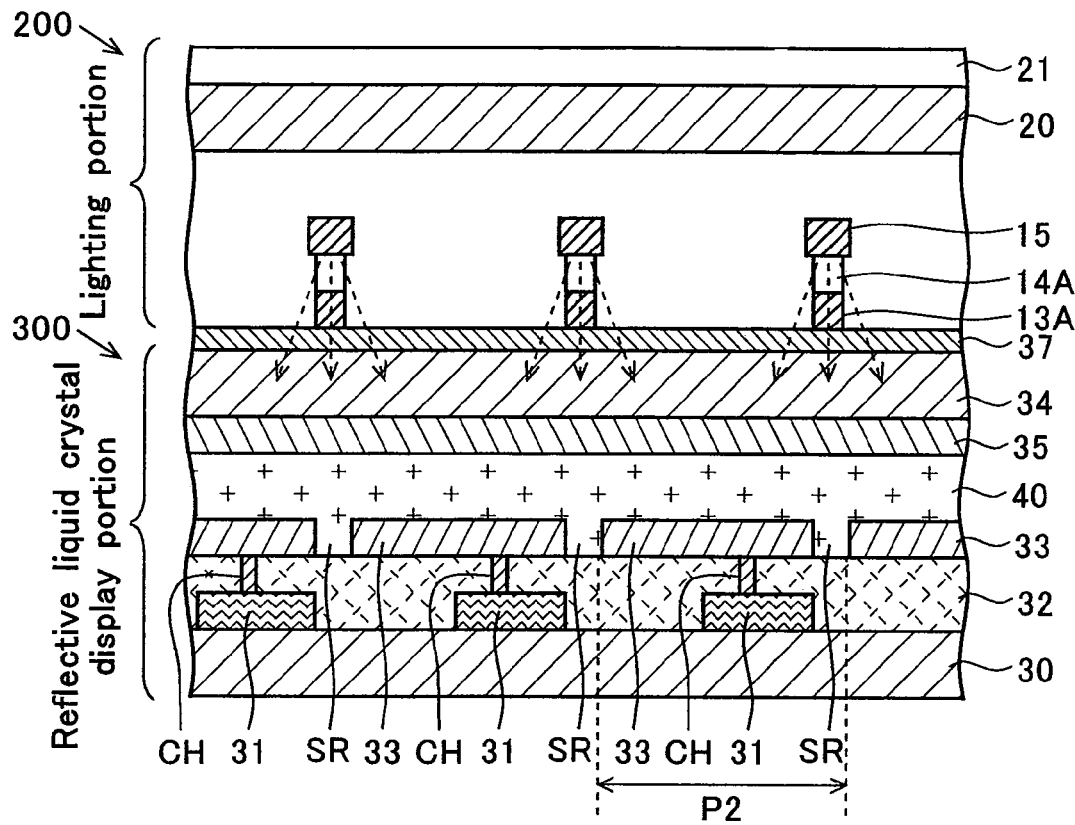
FIG. 15 is a cross-sectional view of a display device of a sixth embodiment of the invention.

Next, a display device of a sixth embodiment of the invention will be described referring to FIG. 15. FIG. 15 is a cross-sectional view showing a structure of a reflective liquid crystal display portion 300 and its connection with a lighting portion 200, which corresponds to the cross-sectional view of FIG. 3 along line X-X. The feature of this embodiment is that the first transparent substrate 10 and the fourth transparent substrate 34 of the fifth embodiment are combined together as a transparent substrate. That is, a first transparent substrate 10 is omitted and an organic EL element 12 is formed on a fourth transparent substrate 34 as shown in FIG. 15. This can reduce the total thickness of the display device and a cost.

It is possible to dispose the lines of the cathode layers 15 above the reflective pixel electrode 33 and not above the separating region SR by adjusting the pitch of the lines of the cathode layers 15. The cathode layers 15 can also form a mesh pattern as well as the linear pattern.

Figure 16:
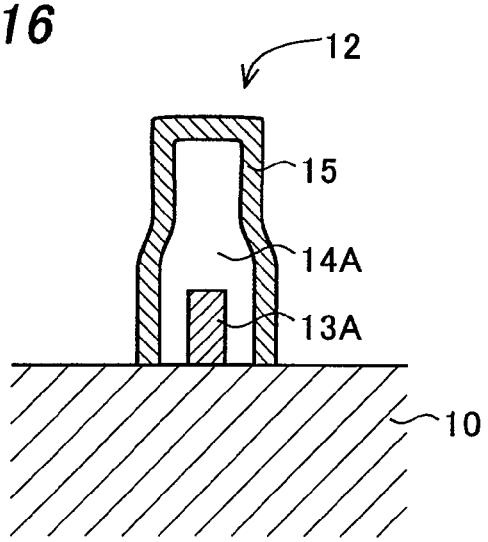
FIG. 16 is a cross-sectional view of an organic EL element 12.

In the fifth and sixth embodiments, the cathode layer 15 can be formed so as to cover the organic layer 14 and the anode layer 13 as shown in FIG. 16.

A display device of a seventh embodiment of the invention will be described referring to figures. First, the whole structure of this display device will be described referring to FIG. 17. A lighting portion 200 is attached on a reflective liquid crystal display portion 300. The structure of the lighting portion 200 is as follows. A first transparent substrate 10 and a second transparent substrate 20 made of a glass substrate, etc. are attached to each other with a sealing layer 11 coated on those peripheral portions therebetween. The back surface of the first transparent substrate 10 is attached to the reflective liquid crystal display portion 300.

Differing from the first embodiment, an organic EL element 12 is formed on the front surface of the second transparent substrate 20, that is opposed to the first transparent substrate 10. Thus, the organic EL element 12 is sealed in a space surrounded by the first transparent substrate 10, the second transparent substrate 20, and the sealing layer 11. The organic EL element 12 is formed in a region corresponding to a pixel region 310 (see FIG. 3) of the reflective liquid crystal display portion 300.

The organic EL element 12 is of a top emission type, and includes an anode layer 13 formed on the second transparent substrate 20, an organic layer 14 covering this anode layer 13, and a plurality of cathode layers 15 formed on this organic layer 14 to have a linear pattern. A plurality of light shield layers 18 shielding light emitted by the organic EL element 12 is formed under the anode layer 13, having a linear pattern corresponding to the cathode layer 15.

The anode layer 13 is made of a transparent conductive material such as ITO (Indium Tin Oxide) or IZO (Indium Zinc Oxide). The organic layer 14 is made of an electron transport layer, an emissive layer, and a hole transport layer. The cathode layer 15 is made of a semitransparent electrode material, for example, a silver layer (Ag layer) or a gold layer (Au layer). The anode layer 13 is 100 mn, the organic layer 14 is 200 nm, and the cathode layer 15 is 10 nm in thickness.

A portion of the organic layer 14 that is interposed between the anode layer 13 and the cathode layer 15 is an emissive region. That is, the organic layer 14 immediately under the cathode layer 15 is the emissive region, and this emissive region forms the same linear pattern as the cathode layer 15 in its plan view. The emissive region emits light by applying a positive potential to the anode layer 13 and a negative potential to the cathode layer 15.

Light emitted downward from the emissive region goes to the reflective liquid crystal display portion 300 through the cathode layer 15. Most of light emitted upward from the emissive region is shielded by the light shield layer 18. This minimizes the light emitted from the emissive region from directly entering the eyes of a viewer watching the lighting portion 200 from thereabove, and thus enhances the display contrast of the reflective liquid crystal display portion 300.

The anode layer 13 can be formed in a predetermined region by a photoetching technology after a transparent conductive material such as ITO or IZO is formed on the second transparent substrate 20, covering the light shield layer 18 that is previously formed and the second transparent substrate. The organic layer 14 and the cathode layer 15 can be formed in a predetermined region by a vapor-deposition method using a mask.

Since moisture infiltration degrades the emission characteristics of the organic EL element 12, it is preferable to form a desiccant layer 16 on the front surface of the first transparent substrate 10 so as to face the second transparent substrate 20, for preventing the infiltration. Moisture infiltrating into the sealed space through the sealing layer 11 is absorbed by the desiccant layer 16.

It is preferable that the desiccant layer 16 is formed on the peripheral portion of the first transparent substrate 10 without overlapping the organic EL element 12 so as to avoid blocking external light entering the organic EL element 12 through the second transparent substrate 20. However, the desiccant layer 16 is not necessarily formed in such a manner when it is made of a transparent material. It is preferable to attach an antireflection film 21 on the back surface of the second transparent substrate 20 for preventing reflection of external light.

Figure 18:
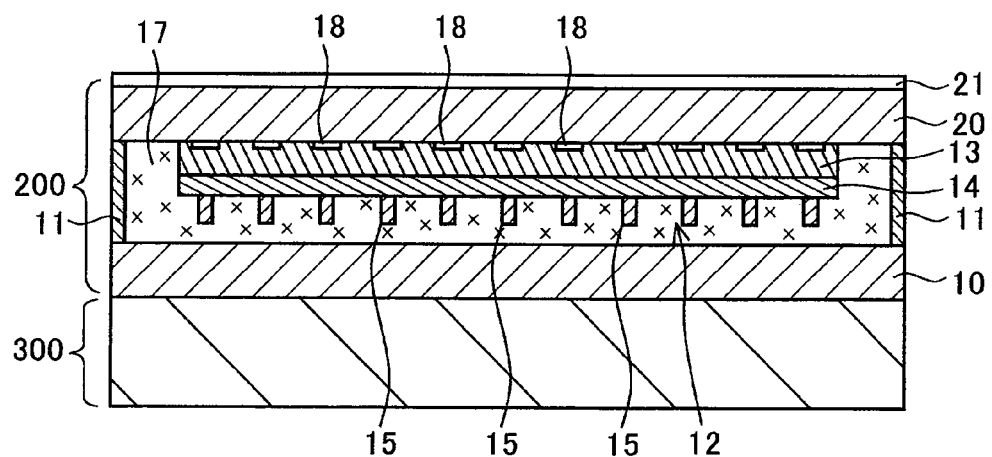
FIG. 18 is a second cross-sectional view of the display device of the seventh embodiment of the invention.

It is possible to fill the space surrounded by the first transparent substrate 10, the second transparent substrate 20, and the sealing layer 11 with resin 17 having the same or almost the same refractive index as that of the first transparent substrate, as shown in FIG. 18. This can certainly block moisture from infiltrating through the sealing layer 11. Alternatively, the resin 17 and the sealing layer 11 can be formed integrally.

Figure 17:
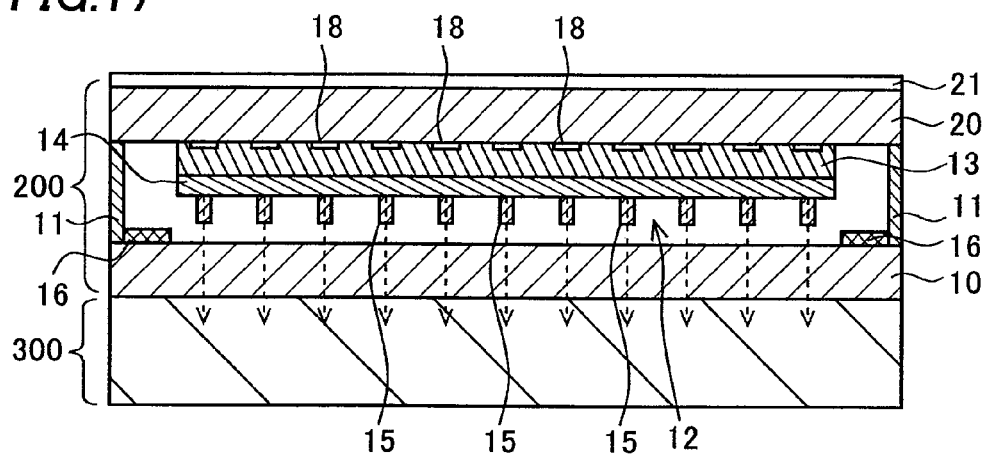
FIG. 17 is a first cross-sectional view of a display device of a seventh embodiment of the invention.

Since an air layer exists between the organic EL element 12 and the first transparent substrate 10 in the structure of FIG. 17, external light entering the second transparent substrate 20 is reflected by an interface between the air layer and the first transparent substrate 10, thereby degrading the contrast of a liquid crystal display. On the other hand, in the structure of FIG. 18, external light entering the second transparent substrate 20 enters the reflective liquid crystal display portion 300 without reflected by the interface of the first transparent substrate 10, thereby enhancing the contrast of a liquid crystal display. It is possible to provide the structure of FIG. 18 with the desiccant layer 16 of FIG. 17.

Figure 19:
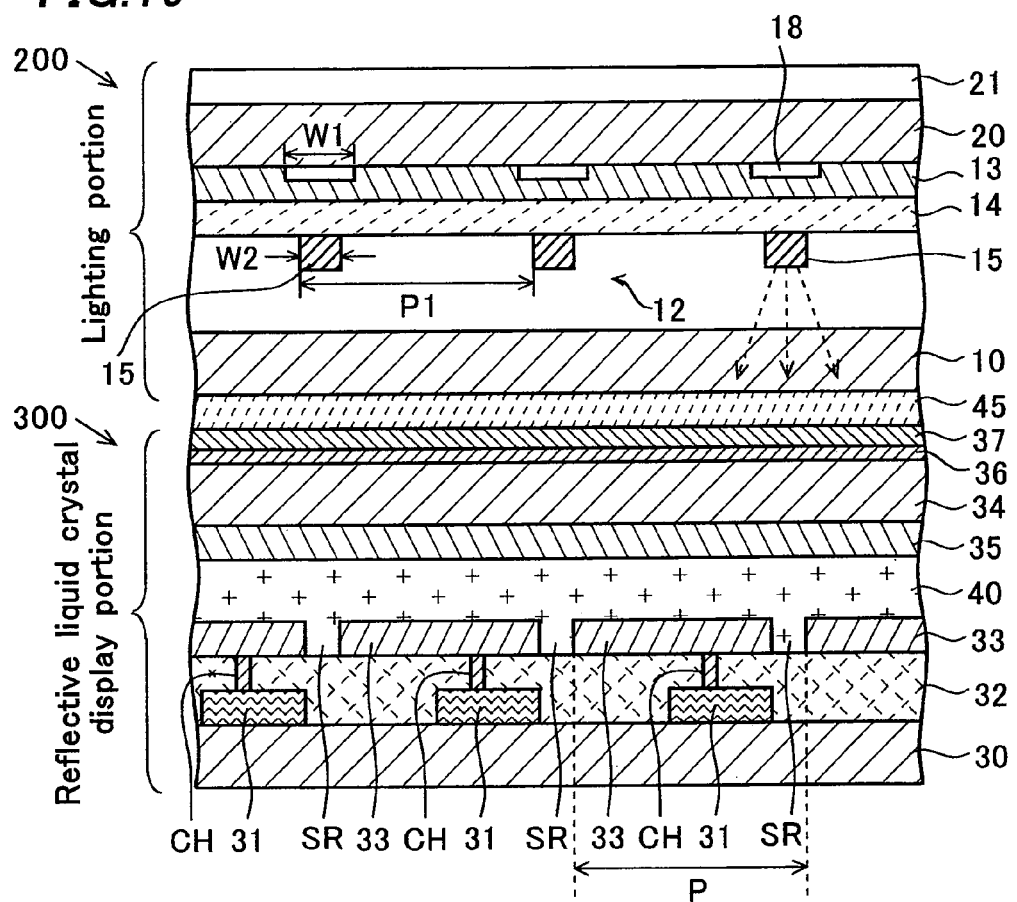
FIG. 19 is a cross-sectional view of FIG. 3 along line X-X.

Next, the structure of the reflective liquid crystal display portion 300 lighted by the described lighting portion 200 and its connection with the lighting portion 200 will be described referring to FIGS. 3 and 19. FIG. 3 is a plan view of a portion of the pixel region 310 of the liquid crystal display portion 300, and FIG. 19 is a cross-sectional view of FIG. 3 along line X-X.

A switching TFT 31 is formed in each of the plurality of pixels provided on a third transparent substrate 30 (TFT substrate) made of a glass substrate. The TFT 31 is covered with an interlayer insulation film 32, and a reflective pixel electrode 33 made of a reflective material such as aluminum (Al) is formed on the interlayer insulation film 32, corresponding to each of the TFTs 31. The reflective pixel electrode 33 is connected with a drain or a source of the corresponding TFT 31 through a contact hole CH formed in the interlayer insulation film 32.

A fourth transparent substrate 34 (opposing substrate) made of a glass substrate is disposed, being opposed to the third transparent substrate 30 formed with the reflective pixel electrodes 33. A common electrode 35 made of ITO is formed on the front surface of the fourth transparent substrate 34. A light scattering layer 36 made of a diffusion adhesion layer and a polarizing plate 37 are layered on the back surface of the fourth transparent substrate 34 in this order. The light scattering layer 36 is provided for scattering light from the lighting portion 200 to equally irradiate the pixel electrode 33 with the light. A liquid crystal layer 40 is sealed between the fourth transparent substrate 34 and the third transparent substrate 30.

With the described structure, light emitted from the lighting portion 200 is polarized in a predetermined direction by the polarizing plate 37, passes through the light scattering layer 36, the fourth transparent substrate 34, and the common electrode 35, enters the liquid crystal layer 40, and is reflected by the reflective pixel electrodes 33. The light reflected by the reflective pixel electrodes 33 returns through the same route and is visually recognized by a viewer through spaces between the lines of the cathode layers 15.

At this time, light transmittance changes in each of the pixels by an electric field applied between the pixel electrodes 33 and the common electrode 35. Therefore, intensity of light reflected by the pixel electrodes 33 changes in each of the pixels, so that a LCD display can be realized. The light shield layer 18 of the lighting portion 200 prevents leakage of the light from the light emissive region of the organic EL element 12 as described above, thereby enhancing the contrast of the LCD display.

It is preferable that the lighting portion 200 is disposed above the reflective liquid crystal display portion 300 adjacently. However, if an air layer exists between the lighting portion 200 and the reflective liquid crystal display portion 300, light emitted from the first transparent substrate 10 of the lighting portion 200 is reflected by an interface between the first transparent substrate 10 and the air layer when entering the air layer and returns to the viewer side, so that the contrast can be degraded.

Therefore, it is preferable to attach the lighting portion 200 and the reflective liquid crystal display portion 300 with a resin layer 45 (e.g. a UV curable resin layer or a visible light curable resin layer) having the same refractive index as that of the first transparent substrate 10 interposed therebetween, for preventing the light reflection.

Next, a positional relationship between the lighting portion 200 and the pixels of the reflective LCD 300 will be described. As shown in FIG. 3, three types of pixels R, G, and B corresponding to three primary colors of red, green, and blue respectively are arrayed in a row direction (x) and a column direction (y) in the pixel region 310 of the reflective liquid crystal display portion 300. Although FIG. 3 shows a delta array where the pixels R, G, and B are shifted in each of the rows, the invention is not limited to this and can form a stripe array where the pixels R, G, and B are arrayed in order in each of the rows. The lines of the cathode layers 15 of the lighting portion 200 extend in the row direction (x) along the boundaries of the pixels R, G, and B.

Each of the pixels has a TFT 31 and a reflective pixel electrode 33. A pitch P1 of the lines of the cathode layers 15 of the lighting portion 200 is equal to a pitch P2 of the pixels. It is preferable to dispose the lines of the cathode layers 15 and the light shield layer 18 of the lighting portion 200 right above separating regions SR of the reflective pixel electrodes 33, which do not contribute to a liquid crystal display. This provides an advantage that most of light reflected by the reflective pixel electrodes 33 is visually recognized by a viewer through the spaces between the lines of the plurality of light shield layers 18 without shielded by the light shield layers 18.

The lines of the light shield layers 18 prevent leakage of light emitted by the emissive region. By setting a width W1 of the lines of the light shield layers 18 larger than a width W2 of the lines of the cathode layers 15, the leakage of the light can be reduced more and the contrast of a liquid crystal display can be further enhanced.

It is possible that the pitch P1 of the lines of the cathode layers 15 of the lighting portion 200 is smaller than the pitch P2 of the pixels and a ratio of the pitch P1 of the lines of the cathode layers 15 to the pitch P2 of the pixels (P1/P2) is 1/natural number. Although interference fringes or moire fringes can occur in a liquid crystal display when the line pitch is equal to the pixel pitch, this setting can prevent such a phenomenon.

Alternatively, it is possible that the pitch P1 of the cathode layers 15 of the lighting portion 200 is larger than the pitch P2 of the pixels and a ratio of the pitch P1 of the lines to the pitch P2 of the pixels (P1/P2) is a natural number. This setting can prevent interference fringes or moire fringes.

The lines of the cathode layers 15 of the lighting portion 200 can obliquely extend deviated from the row direction (x) as shown in FIG. 5. This setting can prevent interference fringes or moire fringes.

Figure 20:
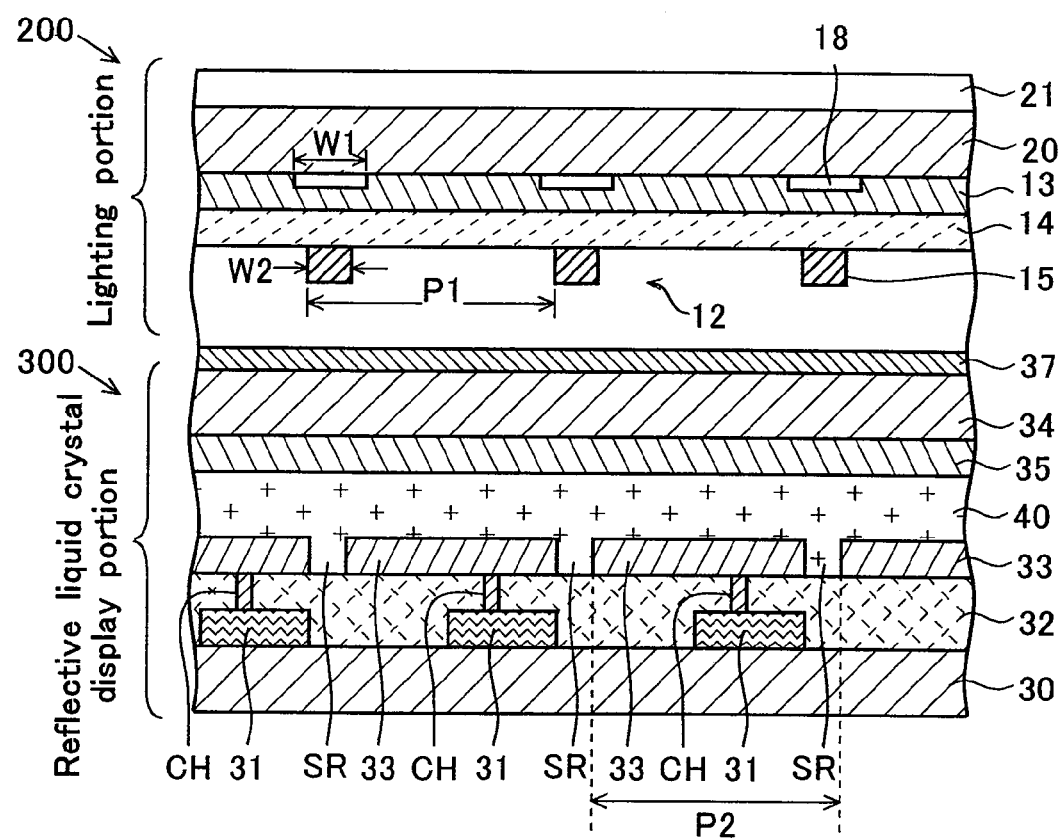
FIG. 20 is a cross-sectional view of a display device of an eighth embodiment of the invention.

Next, a display device of an eighth embodiment of the invention will be described referring to FIG. 20. FIG. 20 is a cross-sectional view showing a structure of a reflective liquid crystal display portion 300 and its connection with a lighting portion 200, which corresponds to the cross-sectional view of FIG. 3 along line X-X. The feature of this embodiment is that the first transparent substrate 10 and the fourth transparent substrate 34 of the first embodiment are combined together as a transparent substrate. That is, as shown in FIG. 20, a first transparent substrate 10 is omitted and an organic EL element 12 is formed on a fourth transparent substrate 34 with a polarizing plate 37 interposed therebetween. This can reduce the total thickness of the display device and a cost.

Figure 21:
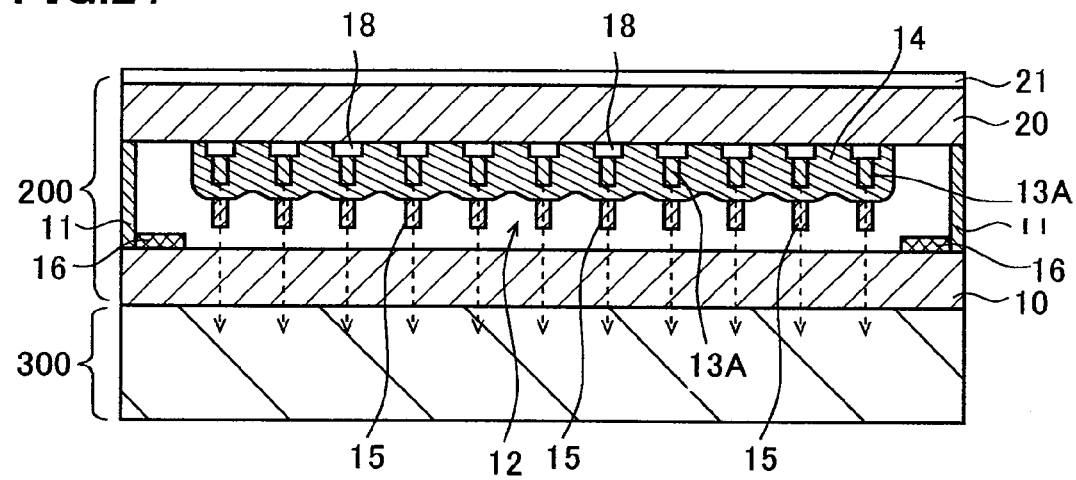
FIG. 21 is a first cross-sectional view of a display device of a ninth embodiment of the invention.

Next, a display device of a ninth embodiment of the invention will be described referring to figures. FIG. 21 is a cross-sectional view of the whole display device. An anode layer 13A of the organic EL element 12 has a linear pattern in this embodiment, while the anode layer 13 of the organic EL element 12 of the seventh embodiment (FIG. 17) does not have a linear pattern.

That is, the plurality of anode layers 13A having a linear pattern is formed on the second transparent substrate 20, an organic layer 14 is formed covering these anode layers 13A, and a plurality of cathode layers 15 having the same linear pattern is formed on this organic layer 14. The lines of the cathode layers 15A and the lines of the anode layers 13A formed thereunder are superposed. The other structure than this is the same as that of the seventh embodiment.

When the anode layer 13 made of ITO or IZO is formed on the second transparent substrate 20 without being separated into plural numbers as in the seventh embodiment (FIG. 17), external light entering through the second transparent substrate 20 is reflected by the anode layer 13 due to a difference in refractive index, thereby degrading the contrast of a liquid crystal display. On the other hand, light passing between the lines of the anode layers 13A is not reflected by the anode layer 13A in this embodiment. Therefore, light transmittance increases, thereby enhancing the contrast of a liquid crystal display.

Figure 22:
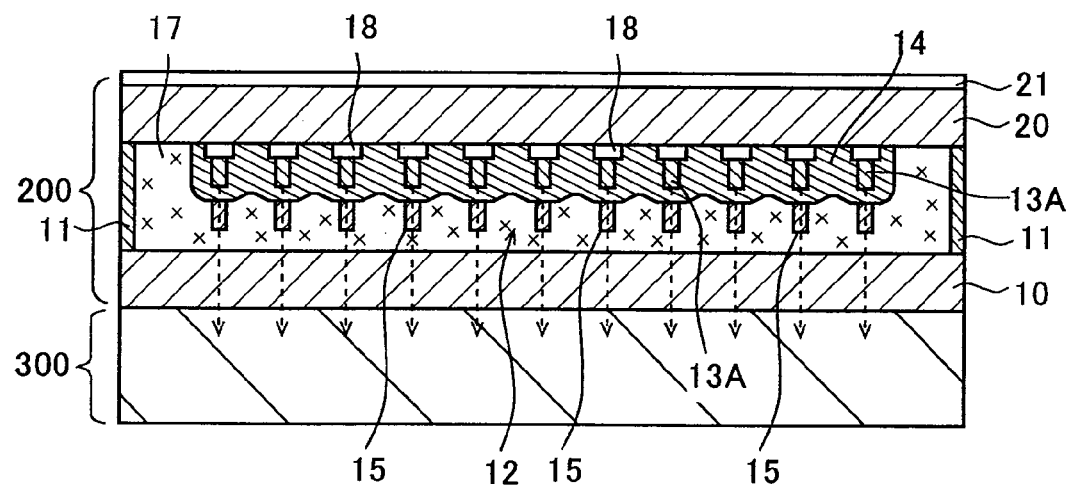
FIG. 22 is a second cross-sectional view of the display device of the ninth embodiment of the invention.

Although a desiccant layer 16 is formed on the front surface of a first transparent substrate 10 so as to face the second transparent substrate 20 in the structure of FIG. 21, it is possible to fill a space surrounded by the first transparent substrate 10, the second transparent substrate 20, and the sealing layer 11 with resin 17 having the same refractive index as that of the first transparent substrate as shown in FIG. 22.

Figure 23:
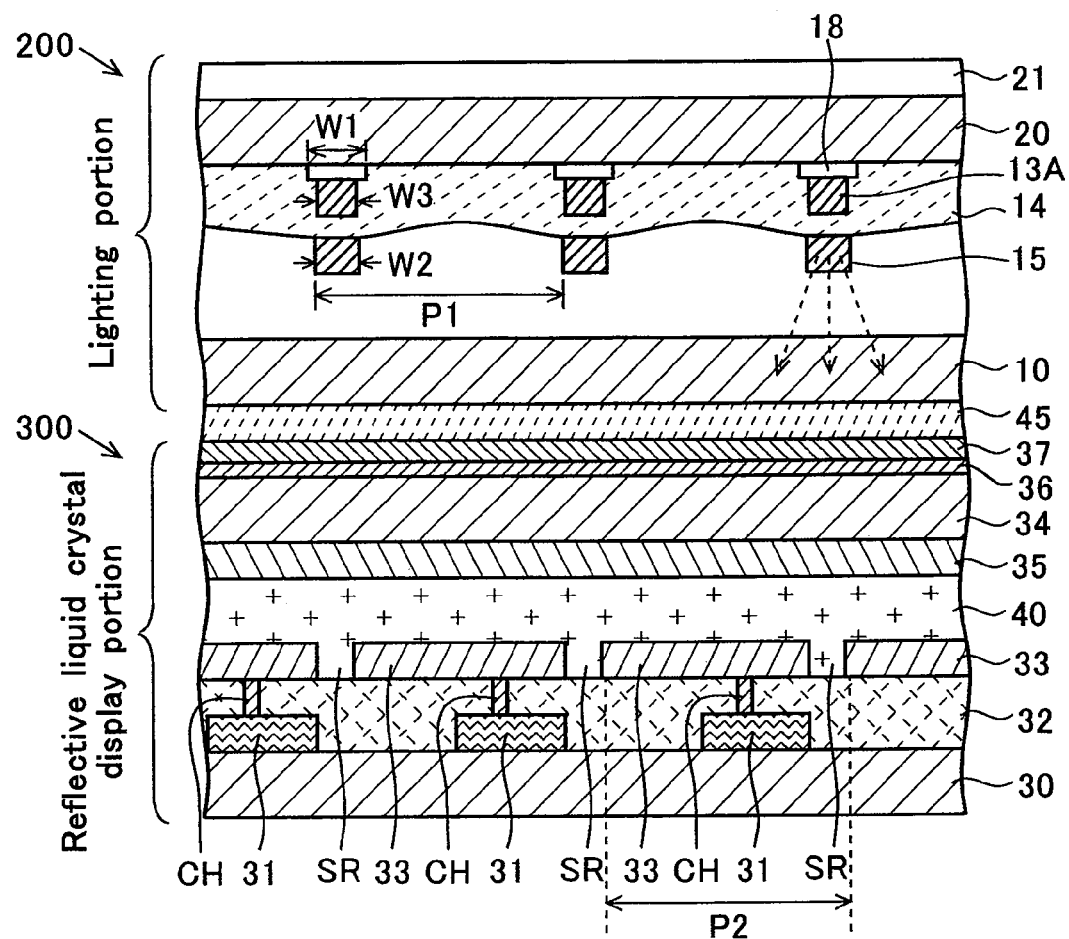
FIG. 23 is a third cross-sectional view of the display device of the ninth embodiment of the invention.

FIG. 23 is a cross-sectional view showing a structure of the reflective liquid crystal display portion 300 and its connection with the lighting portion 200, which corresponds to the cross-sectional view of FIG. 3 along line X-X. The structure of the reflective liquid crystal display portion 300 is totally the same as that of the seventh embodiment. It is preferable to dispose the lines of the cathode layers 15 of the lighting portion 200 right above the separating regions SR of the reflective pixel electrodes 33, which do not contribute to a liquid crystal display, as described above. The lines of the anode layers 1 3A are also superposed on the lines of the cathode layers 15.

A portion of the organic layer 14 interposed between the lines of the anode layers 13A and the lines of the cathode layers 15 serves as an emissive region. The lines of the light shield layers 18 prevent leakage of light emitted by the emissive region. By setting a width W1 of the lines of the light shield layers 18 larger than a width W2 of the lines of the cathode layers 15 and a width W3 of the lines of the anode layer 13A, the leakage of the light can be reduced more and the contrast of a liquid crystal display can be further enhanced.

Figure 24:
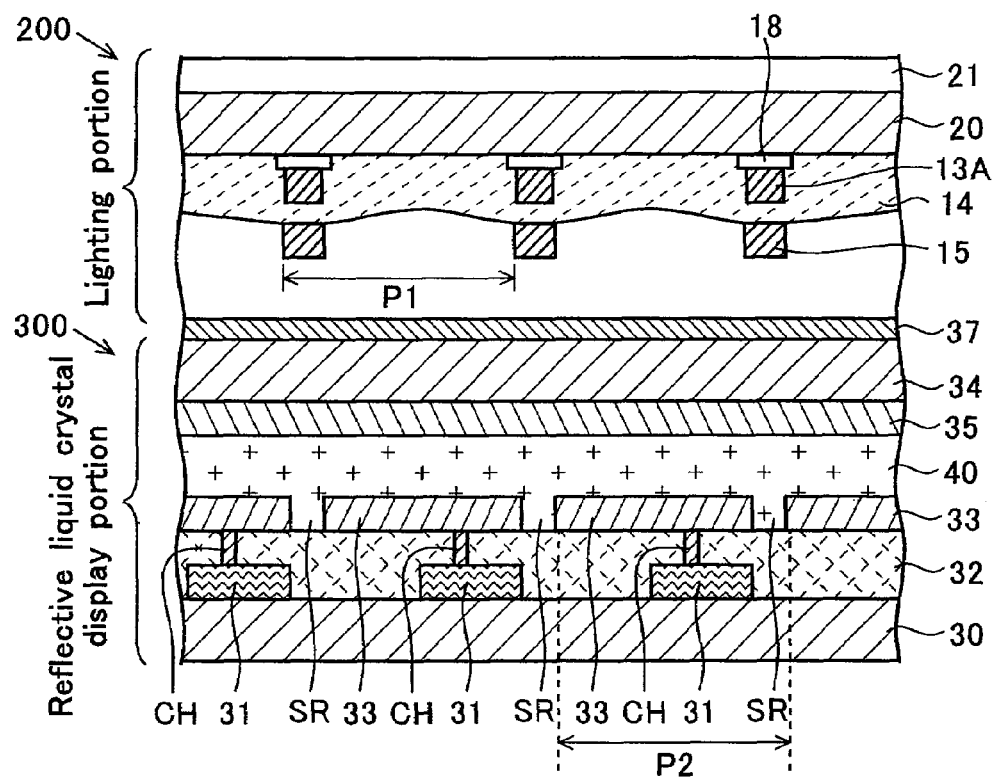
FIG. 24 is a cross-sectional view of a display device of a tenth embodiment of the invention.

Next, a display device of a tenth embodiment of the invention will be described referring to FIG. 24. FIG. 24 is a cross-sectional view showing a structure of a reflective liquid crystal display portion 300 and its connection with a lighting portion 200, which corresponds to the cross-sectional view of FIG. 3 along line X-X. The feature of this embodiment is that the first transparent substrate 10 and the fourth transparent substrate 34 of the ninth embodiment are combined together as a transparent substrate. That is, a first transparent substrate 10 is omitted and an organic EL element 12 is formed on a fourth transparent substrate 34 as shown in FIG. 24. This can reduce the total thickness of the display device and a cost.

Figure 25:
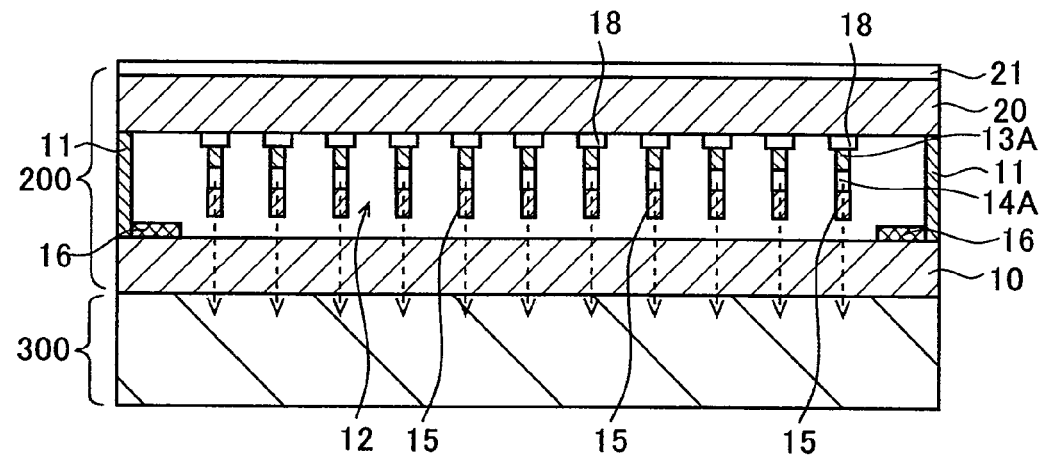
FIG. 25 is a first cross-sectional view of a display device of an eleventh embodiment of the invention.

Next, a display device of an eleventh embodiment of the invention will be described referring to figures. FIG. 25 is a cross-sectional view of the whole display device. An anode layer 13A and an organic layer 14A of the organic EL element 12 have a linear pattern in this embodiment, while the anode layer 13 and the organic layer 14 of the organic EL element 12 of the seventh embodiment (FIG. 17) do not have a linear pattern.

That is, the plurality of anode layers 13A having a linear pattern is formed on the second transparent substrate 20 with a light shield layer 18 interposed therebetween, the plurality of organic layers 14A having a linear pattern is layered on these anode layers 13A, and the plurality of cathode layers 15 having the same linear pattern is formed on these organic layers 14A. The lines of the cathode layers 15A, and the lines of the organic layers 14A and the lines of the anode layers 13A formed thereunder are superposed. The other structure than this is the same as the structure of the seventh embodiment.

When the anode layer 13 made of ITO or IZO having a nonlinear pattern is formed on the second transparent substrate 20 as in the seventh embodiment (FIG. 17), external light entering through the second transparent substrate 20 or light emitted by the organic EL element 12 is reflected by the anode layer 13 due to a difference in refractive index, thereby degrading the contrast of a liquid crystal display. The same reflection occurs by the organic layer 14, too.

On the other hand, light passing between the lines of the anode layers 13A and the organic layers 14A is not reflected by these layers in this embodiment. Therefore, light transmittance increases, enhancing the contrast of a liquid crystal display.

Figure 26:
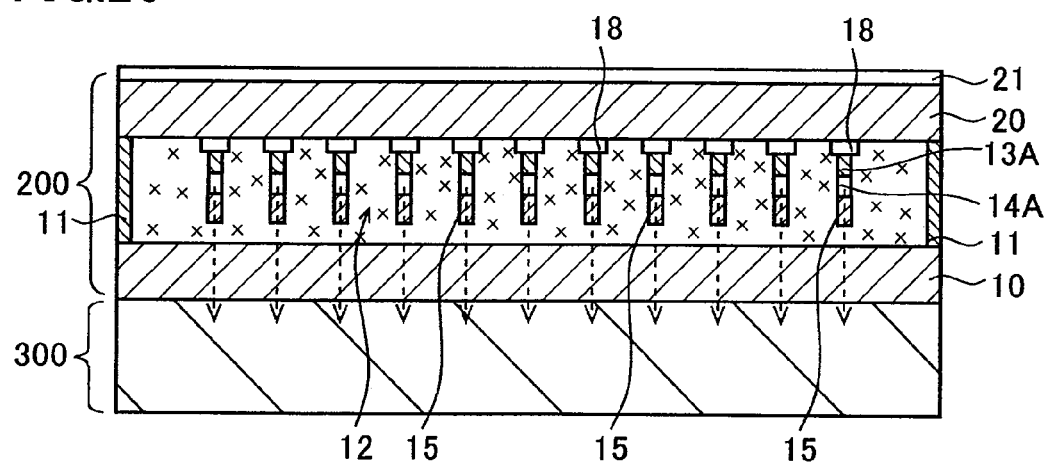
FIG. 26 is a second cross-sectional view of the display device of the eleventh embodiment of the invention.

Although a desiccant layer 16 is formed on the front surface of the first transparent substrate 10, facing the second transparent substrate 20 in the structure of FIG. 25, it is possible to fill a space surrounded by the first transparent substrate 10, the second transparent substrate 20, and the sealing layer 11 with resin 17 having the same refractive index as that of the first transparent substrate as shown in FIG. 26.

Figure 27:
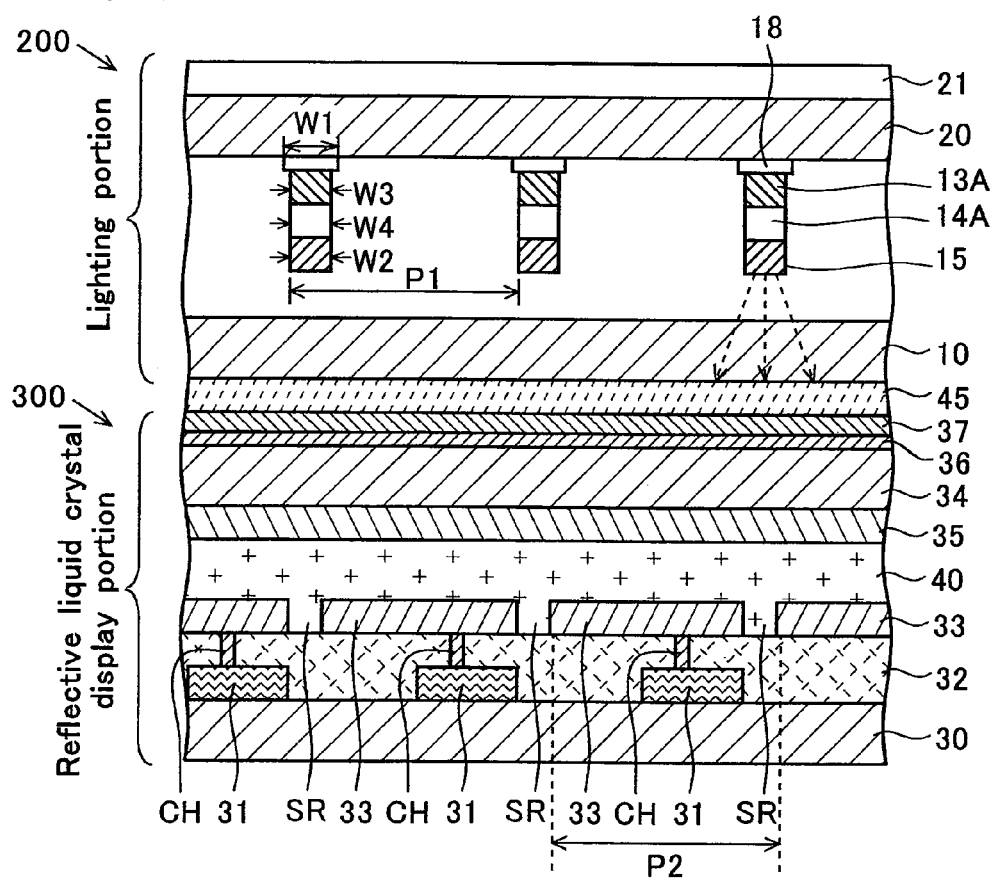
FIG. 27 is a third cross-sectional view of the display device of the eleventh embodiment of the invention.

FIG. 27 is a cross-sectional view showing a structure of the reflective liquid crystal display portion 300 and its connection with the lighting portion 200, which corresponds to the cross-sectional view of FIG. 3 along line X-X. The structure of the reflective liquid crystal display portion 300 is totally the same as that of the seventh embodiment. It is preferable to dispose the lines of the light shield layers 18 and the lines of the cathode layers 15 of the lighting portion 200 right above the separating regions SR of the reflective pixel electrodes 33, which do not contribute to a liquid crystal display, as described above. The lines of the anode layers 13A and the organic layers 14A are also superposed on the lines of the cathode layers 15. The lines of the organic layers 14A interposed between the lines of the anode layers 13A and the lines of the cathode layers 15 serve as the emissive regions. The lines of the light shield layers 18 prevent leakage of light emitted by the emissive regions. By setting the width W1 of the lines of the light shield layers 18 larger than a width W2 of the lines of the cathode layers 15, a width W3 of the lines of the anode layers 13A, and a width W4 of the lines of the organic layers 14A, the leakage of the light can be reduced more and the contrast of a liquid crystal display can be further enhanced.

Figure 28:
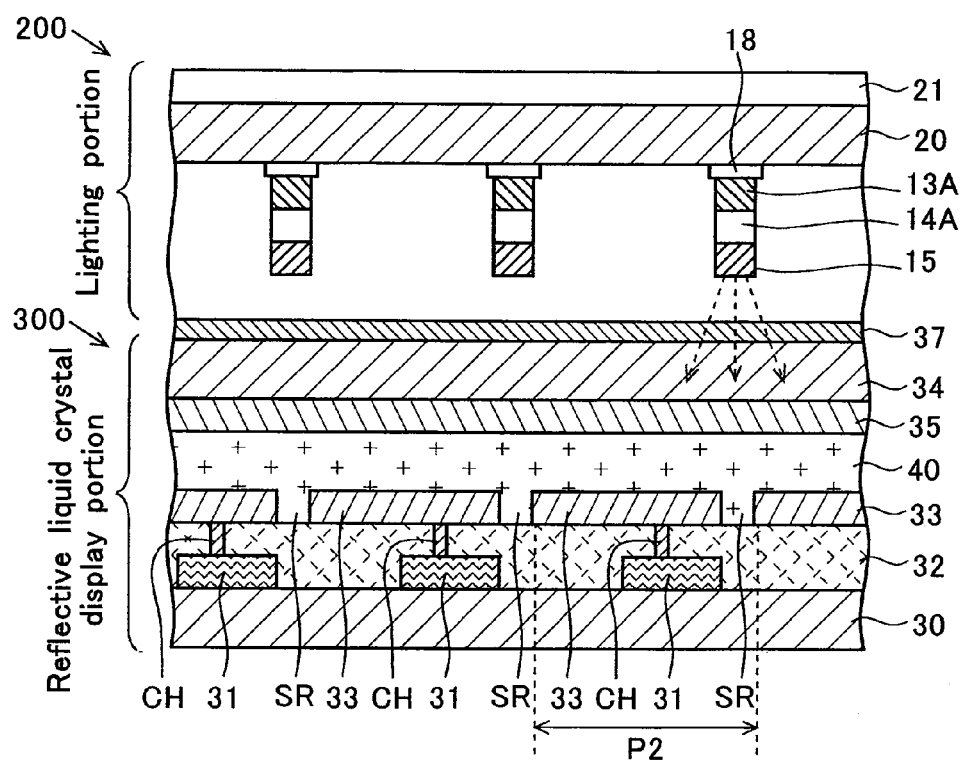
FIG. 28 is a cross-sectional view of a display device of a twelfth embodiment of the invention.

Next, a display device of a twelfth embodiment of the invention will be described referring to FIG. 28. FIG. 28 is a cross-sectional view showing a structure of the reflective liquid crystal display portion 300 and its connection with the lighting portion 200, which corresponds to the cross-sectional view of FIG. 3 along line X-X. The feature of this embodiment is that the first transparent substrate 10 and the fourth transparent substrate 34 of the eleventh embodiment are combined together as a transparent substrate. That is, a first transparent substrate 10 is omitted and an organic EL element 12 is formed on a fourth transparent substrate 34 as shown in FIG. 28. This can reduce the total thickness of the display device and a cost.

Figure 29:
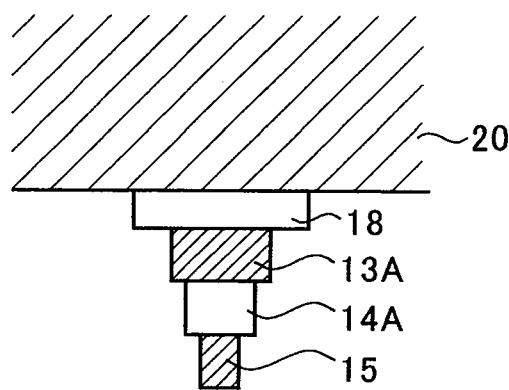
FIG. 29 is a cross-sectional view of an organic EL element.

In the eleventh and twelfth embodiments, the organic EL element 12 can have a structure shown in FIG. 29 in its cross-section. That is, the width of the lines of the anode layer 13A is smaller than the light shield layer 18, the width of the lines of the organic layer 14A is smaller than the width of the lines of the anode layer 13A, and the width of the lines of the cathode layer 15 is smaller than the width of the lines of the organic layer 14A.

Figure 30:
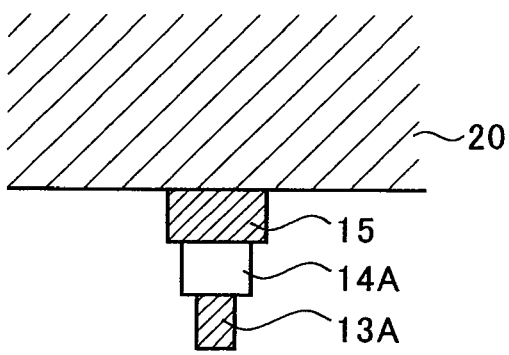
FIG. 30 is a cross-sectional view of an organic EL element.
Figure 31:
FIG. 31 is a view of a reflective LCD with a front light.
Figure 31:
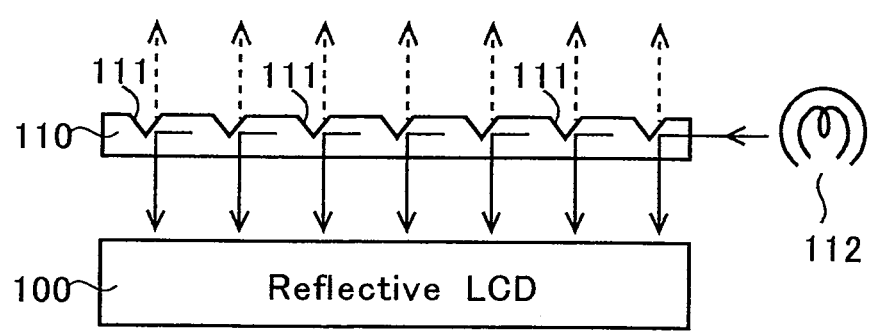

Furthermore, in the ninth, tenth, eleventh, and twelfth embodiments, when the cathode layer 15 is made of an opaque light shield material such as aluminum (Al), the cathode layer 15 functions as a light shield layer in itself as shown in FIG. 30, so that the light shield layer 18 is not needed. In this case, the organic EL element 12 is formed by layering the cathode layer 15, the organic layer 14A, and the anode layer 13A on the second transparent substrate 20 in this order. The width of the organic layer 14A is larger than that of the anode layer 13A, and the width of the cathode layer 15 is larger than the width of the organic layer 14A.

In the seventh to twelfth embodiments, it is possible to dispose the lines of the cathode layer 15 and the light shield layer 18 above the reflective pixel electrodes 33 and not above the separating regions SR by adjusting the pitch of these lines. Furthermore, the pattern of the cathode layer 15 and the light shield layer 18 can be a mesh pattern as well as the linear pattern.

Figure 32:
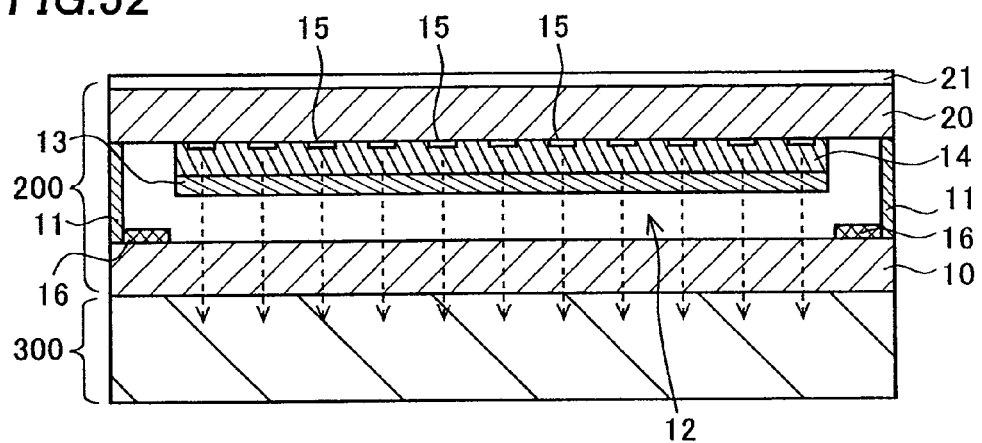
FIG. 32 is a cross-sectional view of a display device of a thirteenth embodiment of the invention.
Figure 33:
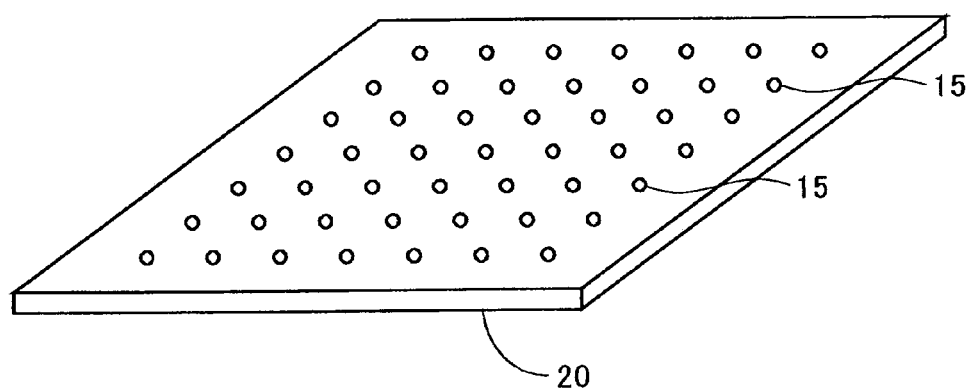
FIG. 33 is a pattern view of a cathode layer of the display device of the thirteenth embodiment of the invention.

Next, a display device of a thirteenth embodiment of the invention will be described referring to FIG. 32. FIG. 32 is a cross-sectional view showing a structure of a reflective liquid crystal display portion 300 and its connection with a lighting portion 200. The feature of this embodiment is that a cathode layer 15 having a predetermined pattern is disposed on a second transparent substrate 20, an organic layer 14 is formed covering the cathode layer 15, and an anode layer made of a semitransparent or transparent material is formed on the organic layer 14. The pattern of the cathode layer 15 is a linear pattern or a dot pattern as shown in FIG. 33. The cathode layer 15 is made of an opaque light shield material such as aluminum (Al) and functions as a light shield layer in itself. The other structure is the same as the seventh to twelfth embodiments of the invention.

Figure 34:
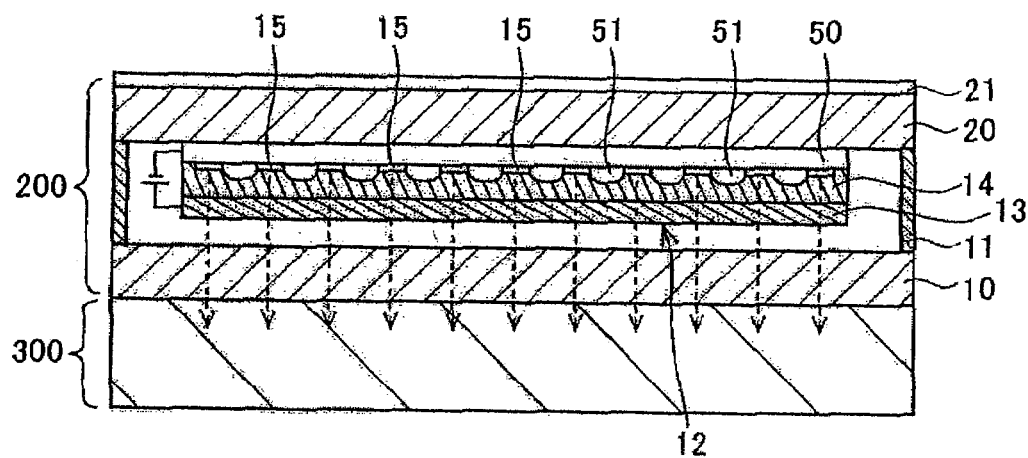
FIG. 34 is a cross-sectional view of a display device of a fourteenth embodiment of the invention.

Next, a display device of a fourteenth embodiment of the invention will be described referring to FIG. 34. FIG. 34 is a cross-sectional view showing a structure of a reflective liquid crystal display portion 300 and its connection with a lighting portion 200. This embodiment differs from the thirteenth embodiment in a point that a transparent electrode layer 50 is formed on a second transparent substrate 20 and a cathode layer 15 having a predetermined pattern is disposed on the transparent electrode layer 50. Furthermore, an insulation layer 51 fills the openings of the patterned cathode layer 51, and the transparent electrode layer 50 and the cathode layer 15 are electrically connected with each other in locations where the insulation layer 51 is not provided. The pattern of the cathode layer 15 is a linear pattern or a dot pattern in the same manner as the thirteenth embodiment.

What is claimed is:

1. A display device comprising:
   a lighting portion comprising a first substrate comprising a front surface and a back surface, an organic electroluminescent portion disposed on the front surface of the first substrate, a second substrate and a sealing layer attaching the first substrate to the second substrate so as to seal the organic electroluminescent portion therebetween, the organic electroluminescent portion comprising a patterned anode layer disposed on the front surface and made of a transparent electrode material, a patterned organic layer disposed on the patterned anode layer and a patterned cathode layer disposed on the patterned organic layer; and
   a reflective liquid crystal display device attached to the back surface of the first substrate and comprising a third substrate, a plurality of reflective pixel electrodes disposed on the third substrate, a liquid crystal layer disposed over the reflective pixel electrodes and a common electrode disposed on the liquid crystal layer, the reflective pixel electrodes being configured to receive light emitted from the lighting portion and define a plurality of pixels,
   wherein a width of a pattern of the patterned cathode layer is larger than a width of a pattern of the patterned anode layer and is larger than a width of a pattern of the patterned organic layer.

2. The display device of claim 1, further comprising a fourth substrate that is disposed between the first substrate and the common electrode and having the common electrode thereon.

3. The display device of claim 1, wherein the anode layer, the organic layer and the cathode layer are patterned to have a plurality of stripes, and a pitch of the stripes is equal to a pitch of the pixels.

4. The display device of claim 1, wherein the anode layer, the organic layer and the cathode layer are patterned to have a plurality of stripes, and a pitch of the stripes is equal to a pitch of the pixels divided by a natural number.

5. The display device of claim 1, wherein the anode layer, the organic layer and the cathode layer are patterned to have a plurality of stripes, and a pitch of the stripes is equal to a pitch of the pixels multiplied by a natural number.

6. The display device of claim 1, further comprising a desiccant layer disposed on the second substrate so as to face the front surface of the first substrate.

7. The display device of claim 1, further comprising a resin or a desiccant that fills a space between the first and second substrates and has the same refractive index as the second substrate.

8. The display device of claim 2, wherein the anode layer, the organic layer and the cathode layer are patterned to have a plurality of stripes, and a pitch of the stripes is equal to a pitch of the pixels.

9. The display device of claim 2, wherein the anode layer, the organic layer and the cathode layer are patterned to have a plurality of stripes, and a pitch of the stripes is equal to a pitch of the pixels divided by a natural number.

10. The display device of claim 2, wherein the anode layer, the organic layer and the cathode layer are patterned to have a plurality of stripes, and a pitch of the stripes is equal to a pitch of the pixels multiplied by a natural number.

11. The display device of claim 2, further comprising a desiccant layer disposed on the second substrate so as to face the front surface of the first substrate.

12. The display device of claim 2, further comprising a resin or a desiccant that fills a space between the first and second substrates and has the same refractive index as the second substrate.

13. The display device of claim 1, wherein the patterned cathode layer comprises a metal.

14. The display device of claim 13, wherein the metal is aluminum.

* * * * *